(12) United States Patent
Lee et al.

(10) Patent No.: US 9,853,219 B2
(45) Date of Patent: Dec. 26, 2017

(54) RESISTANCE-SWITCHING DEVICE HAVING CONDUCTIVE FIBER, FABRIC TYPE RESISTANCE-SWITCHING DEVICE ARRAY HAVING THE SAME, MEMORY AND SENSOR HAVING THE DEVICE OR THE ARRAY

(71) Applicant: Kookmin University Industry Academy Cooperation Foundation, Seoul (KR)

(72) Inventors: Mijung Lee, Seoul (KR); Youngdae Seo, Gyeongju-si (KR); Chaewon Kim, Seoul (KR); Museok Ko, Seoul (KR); Anjae Jo, Seoul (KR); Younhee Kim, Seoul (KR); Suji Kim, Seoul (KR); Heejoo Kim, Seoul (KR)

(73) Assignee: KOOKMIN UNIVERSITY INDUSTRY ACADEMY COOPERATION FOUNDATION, Seoul (KR)

( * ) Notice: Subject to any disclaimer, the term of this patent is extended or adjusted under 35 U.S.C. 154(b) by 0 days.

(21) Appl. No.: 15/213,352

(22) Filed: Jul. 18, 2016

(65) Prior Publication Data
US 2017/0033291 A1    Feb. 2, 2017

(30) Foreign Application Priority Data

Jul. 17, 2015  (KR) .......................... 10-2015-0102045
Jul. 18, 2015  (KR) .......................... 10-2015-0102064

(51) Int. Cl.
*H01L 45/00* (2006.01)
*H01L 51/00* (2006.01)
(Continued)

(52) U.S. Cl.
CPC ....... *H01L 51/0048* (2013.01); *D03D 1/0088* (2013.01); *D03D 15/00* (2013.01);
(Continued)

(58) Field of Classification Search
CPC ......... H01L 45/04; H01L 45/06; H01L 45/08; H01L 45/10; H01L 45/12; H01L 45/122;
(Continued)

(56) References Cited

U.S. PATENT DOCUMENTS 4,845,533 A * 7/1989 Pryor .................. H01L 27/2463
257/4
9,397,145 B1 * 7/2016 Sills .................... H01L 27/2427
(Continued)

*Primary Examiner* — Eduardo A Rodela
(74) *Attorney, Agent, or Firm* — Womble Bond Dickinson (US) LLP; Joseph Bach, Esq.

(57) ABSTRACT

Provided is a resistance-switching device. The resistance-switching device includes a first wiring including an aluminum oxide surface layer, and a second wiring including a carbon-containing surface layer in contact with the aluminum oxide surface layer. Electrochemical reaction products according to a reaction of aluminum oxide and carbon are generated or destroyed at a contact interface between the aluminum oxide surface layer and the carbon-containing surface layer according to a voltage or a current applied to the first wiring and the second wiring, and low resistance and high resistance are provided between the first wiring and the second wiring by the generation or destruction of the electrochemical reaction products.

16 Claims, 17 Drawing Sheets

(51) Int. Cl.
  *H01L 51/05*   (2006.01)
  *D03D 1/00*    (2006.01)
  *D03D 15/00*   (2006.01)
  *D03D 15/08*   (2006.01)
  *A41D 1/00*    (2006.01)
  *B82Y 10/00*   (2011.01)
  *B82Y 30/00*   (2011.01)
  *D04B 1/24*    (2006.01)

(52) U.S. Cl.
  CPC ............. *D03D 15/08* (2013.01); *H01L 45/04* (2013.01); *H01L 45/08* (2013.01); *H01L 45/12* (2013.01); *H01L 45/145* (2013.01); *H01L 45/146* (2013.01); *H01L 45/147* (2013.01); *H01L 51/0591* (2013.01); *A41D 1/005* (2013.01); *A41D 2500/10* (2013.01); *A41D 2500/20* (2013.01); *B82Y 10/00* (2013.01); *B82Y 30/00* (2013.01); *D04B 1/24* (2013.01); *D10B 2101/12* (2013.01); *D10B 2101/20* (2013.01); *D10B 2401/16* (2013.01); *D10B 2501/00* (2013.01)

(58) Field of Classification Search
  CPC ............. H01L 45/1206; H01L 45/1233; H01L 45/1253; H01L 45/14; H01L 45/145; H01L 45/146; H01L 45/147; H01L 27/2427; H01L 27/2463; H01L 27/2472
  See application file for complete search history.

(56) References Cited

U.S. PATENT DOCUMENTS

2014/0151623 A1* 6/2014 Jeon ................. H01L 45/04
                                                257/2
2015/0340609 A1* 11/2015 Banno ............... H01L 45/085
                                                257/4
2017/0098685 A1* 4/2017 Konevecki ......... H01L 27/2454

* cited by examiner

I-I'

II-II'

RESISTANCE-SWITCHING DEVICE HAVING CONDUCTIVE FIBER, FABRIC TYPE RESISTANCE-SWITCHING DEVICE ARRAY HAVING THE SAME, MEMORY AND SENSOR HAVING THE DEVICE OR THE ARRAY

CLAIM FOR PRIORITY

This application claims priority to Korean Patent Application No. 10-2015-0102045 filed on Jul. 17, 2015 and Korean Patent Application No. 10-2015-0102064 filed on Jul. 18, 2015 in the Korean Intellectual Property Office (KIPO), the entire contents of which are hereby incorporated by reference.

BACKGROUND

1. Technical Field

Example embodiments of the present invention relate to a memory device and more specifically to a non-volatile memory device using a resistance change.

2. Related Art

Recently, while demand for portable digital devices such as digital cameras, MPEG-1 Audio Layer-3 (MP3) players, personal digital assistants (PDAs), and cellular phones is increased, the non-volatile memory market has expanded rapidly. A NAND flash memory is a representative programmable non-volatile memory device, and a resistive memory device (e.g., a resistive random-access memory (ReRAM)) using a variable resistor of which a resistance value is reversibly changed is being focused on as a non-volatile memory device that can replace the NAND flash memory.

Since the ReRAM uses a physical property, which is a resistance value of a variable resistor, as a state of data by itself, and can be driven with low power, a low-power memory device in which a cell configuration is simplified may be implemented. However, since a typical ReRAM is manufactured to have a metal-insulator-metal (MIM) laminated structure in which a metal, an insulating layer, and a metal are stacked, a high-temperature oxidation process is required to form the insulating layer. The high-temperature oxidation process makes application of polymer elements difficult because it is difficult to perform a high-temperature process using the polymer elements, and thus it is becoming a limiting factor for new applications such as a flexible device. As an alternative technique, a low-temperature process in which the insulating layer is formed using wet coating based on solution is being proposed. However, since it is difficult to obtain a reliable and uniform insulating layer by using such a wet process, the actual application of the non-volatile memory device is limited.

SUMMARY

Accordingly, example embodiments of the present invention are provided to substantially obviate one or more problems due to limitations and disadvantages of the related art.

Example embodiments of the present invention provide a resistance-switching device having two or more resistance value levels which are reversibly changed without a complicated process of forming an insulating layer through the above-described high-temperature oxidation process or wet coating, and in which a reliable operation with excellent process efficiency may be performed.

In some example embodiments, a resistance-switching device includes a resistance-switching device. The resistance-switching device includes a first wiring including an aluminum oxide surface layer and a second wiring including a carbon-containing surface layer in contact with the aluminum oxide surface layer. Electrochemical reaction products according to a reaction of aluminum oxide and carbon are generated or destroyed at a contact interface between the aluminum oxide surface layer and the carbon-containing surface layer according to a voltage or a current applied to the first wiring and the second wiring, and low resistance and high resistance are provided between the first wiring and the second wiring by the generation or destruction of the electrochemical reaction products.

At least one of the first wiring and the second wiring may be a conductive fiber. Both of the first wiring and the second wiring may be conductive fibers. The first wiring may have an aluminum layer below the aluminum oxide surface layer thereof, and the aluminum oxide surface layer may be a native oxide film of the aluminum layer. The first wiring may further include a base layer below the aluminum layer. The second wiring may be a carbon fiber.

The electrochemical reaction products may be aluminium oxycarbide.

The first wiring and the second wiring may serve as a wrap and a weft, respectively, and may constitute a fabric having a woven structure. In another example, the resistance-switching device may further include an insulating support, wherein the first wiring may include a plurality of rows disposed in parallel, the rows may be disposed by repeatedly being extended on an upper surface of the insulating support, passed through the insulating support, extended on a lower surface of the insulating support, and then passed through the insulating support again, and the second wiring may be disposed by repeatedly being extended on the upper surface of the insulating support to cross a first row of the first wiring, passed through the insulating support, extended on the lower surface of the insulating support to cross a second row of the first wiring, and then passed through the insulating support again. In still another example, any one of the first wiring and the second wiring may have a knitted structure, and the other of the first wiring and the second wiring may be disposed to cross the knitted wiring.

The resistance-switching device may be a unit cell constituting a resistance-switching memory. Alternatively, the resistance-switching device may be a sensor that indicates a different resistance value according to an ambient environment. For example, the resistance-switching device may indicate a different resistance value according to a degree of stretching. The resistance-switching device may indicate a different high resistance value according to the degree of stretching. As another example, the resistance-switching device may indicate a different resistance value according to an oxygen concentration or humidity of an ambient environment. The resistance-switching device may indicate a different high resistance value according to the oxygen concentration or humidity of the ambient environment.

In other example embodiments, a cloth with which the resistance-switching device of claim 1 is combined is provided.

In still other example embodiments, a resistance-switching device includes a resistance-switching device. The resistance-switching device may include a first conductive fiber including an aluminum oxide surface layer, and a second conductive fiber including a carbon-containing surface layer in contact with the aluminum oxide surface layer. The first conductive fiber and the second conductive fiber may be woven or knitted, or may have a fabric type which is combined on another insulating support by being stitched thereto.

The first conductive fiber may be an aluminum wire including the aluminum oxide surface layer. The second conductive fiber may be a carbon fiber.

BRIEF DESCRIPTION OF DRAWINGS

Example embodiments of the present invention will become more apparent by describing in detail example embodiments of the present invention with reference to the accompanying drawings, in which.

DESCRIPTION OF EXAMPLE EMBODIMENTS

Figure 1A:
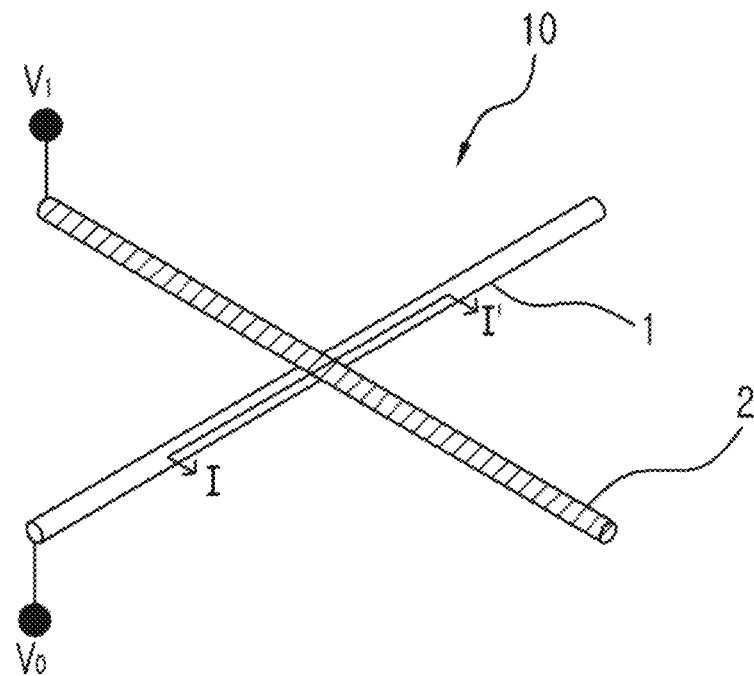
FIG. 1A is a perspective view illustrating a resistance-switching device according to one embodiment of the present invention.

Hereinafter, exemplary embodiments of the present invention will be described in detail with reference to the accompanying drawings.

Embodiments of the present invention are provided to fully explain the present invention to those skilled in the art. The embodiments to be described below may be modified in several different forms, and the scope of the present invention is not limited to the embodiments. Rather, the embodiments are provided to further faithfully and fully explain this disclosure and to fully convey the scope of the present invention to those skilled in the art.

Like reference numerals in the drawings denote like elements. Further, as used herein, the term "and/or" includes any and all combinations of one or more of the associated listed items.

The terminology used herein is for the purpose of describing embodiments only and is not intended to be limiting to the present invention. As used herein, the singular forms "a," "an," and "the" are intended to include the plural forms as well unless clearly indicates otherwise by context. It should be further understood that the terms "comprises," "comprising," "includes," and/or "including" specify the presence of stated features, integers, steps, operations, elements, and/or components when used herein but do not preclude the presence or addition of one or more other features, integers, steps, operations, elements, components, and/or groups thereof.

When a layer is referred to as being "formed on" a substrate or another layer in this specification, the layer may refer to a layer directly formed on the substrate or the other layer, or may refer to an intermediate layer formed on the substrate or the other layer, or a layer formed on the intermediate layer.

The relative terms such as "below," "above," "upper," "lower," "horizontal," or "vertical" used herein may be used to describe a relationship between one member, one layer, or regions and another member, another layer, or other regions as illustrated in the drawings. It should be understood that the terms include other directions of a device as well as directions thereof illustrated in the drawings.

The term "at least one wiring structure" used herein is referred to an individually accessible conductor or a grouped accessible conductor. The conductor may have a linear structure or a planar structure, and the term "linear structure" refers to a structure having an appropriate aspect ratio, which may one-dimensionally and linearly extend and come in point-contact or line-contact with another structure, for example, a fiber. In this case, a wire, a thread, or a yarn may be used as the fiber. The term "planar structure" refers to a structure having an appropriate area, which may two-dimensionally extend and come in line-contact with a linear structure.

The linear structure is not limited to a structure which extends in any one direction, and the structure may extend in directions by being manipulated in various methods such as refracting, bending, spinning, winding, spiraling, meandering, overlapping, twisting, or a combination thereof. In the same manner, the planar structure is not limited to a structure which flatly extends, and the structure may extend in directions by being manipulated in various methods such as refracting, bending, wrinkling, rolling, overlapping, folding, or a combination thereof. The device according to the embodiments of the present invention may be applied to wearable devices and electronic apparatuses which are required to change their shapes by such manipulations.

Figure 1B:
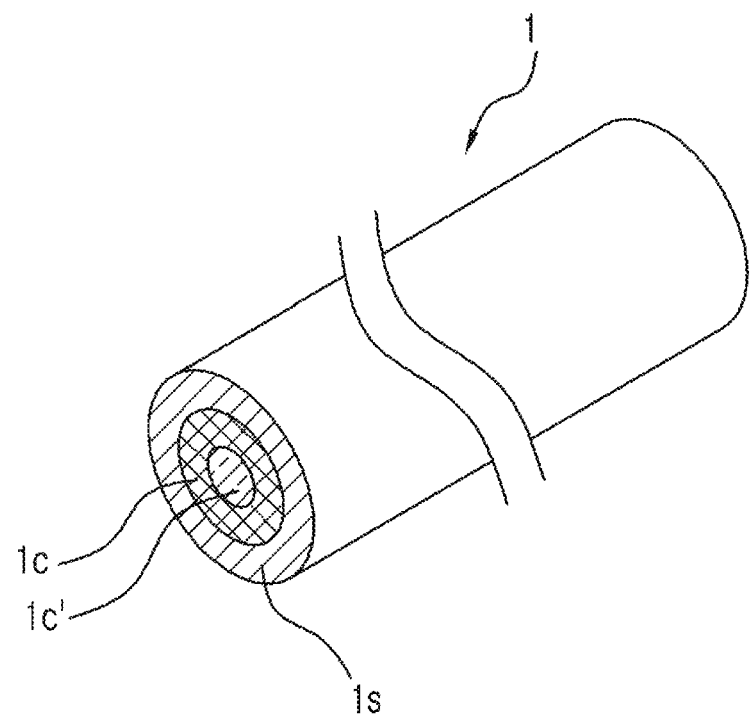
FIG. 1B is a perspective view illustrating a first wiring illustrated in FIG. 1A.
Figure 1C:
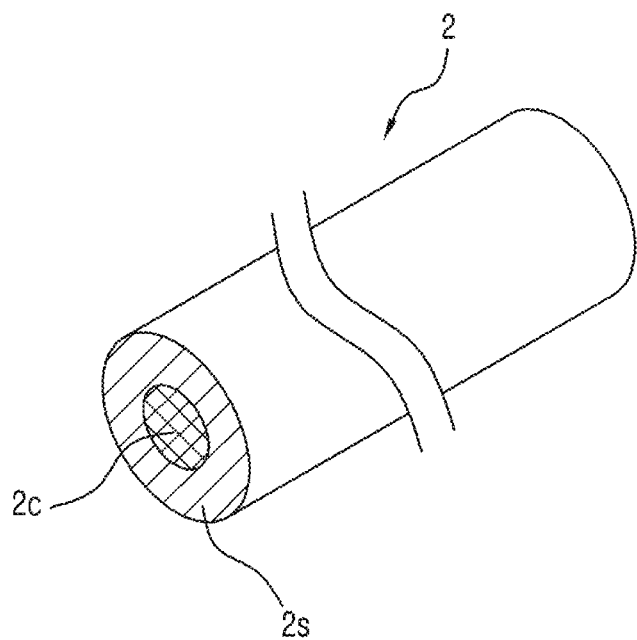
FIG. 1C is a perspective view illustrating a second wiring illustrated in FIG. 1A.
Figure 2:
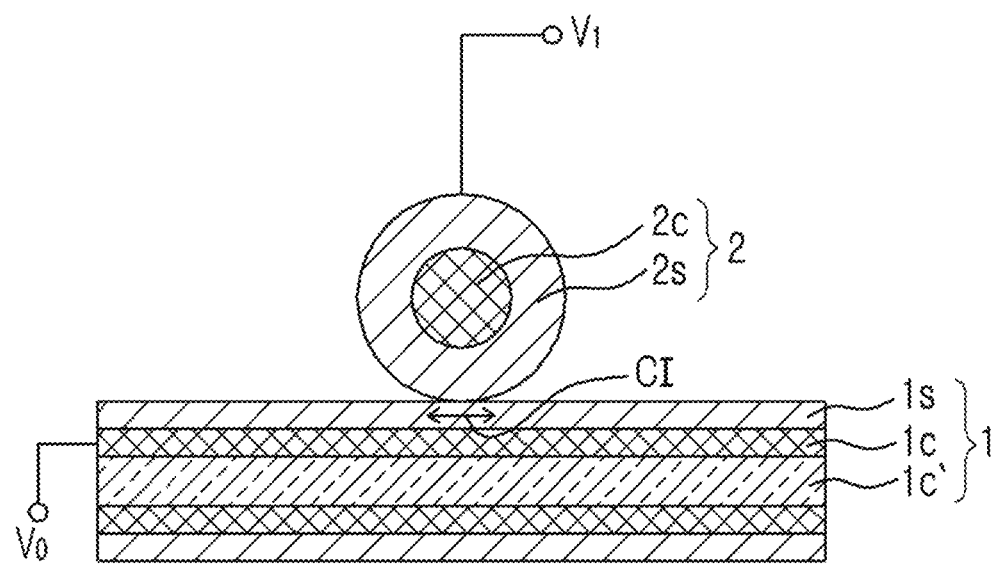
FIG. 2 is a cross-sectional view taken along line I-I' of FIG. 1A.

FIG. 1A is a perspective view illustrating a resistance-switching device according to one embodiment of the present invention, FIG. 1B is a perspective view illustrating a first wiring illustrated in FIG. 1A, and FIG. 1C is a perspective view illustrating a second wiring illustrated in FIG. 1A. FIG. 2 is a cross-sectional view taken along line I-I' of FIG. 1A.

Referring to FIGS. 1A, 1B, 1C, and 2, a resistance-switching device 10 includes a first wiring 1 and a second wiring 2 in contact with the first wiring 1. The first wiring 1 and/or the second wiring 2 may be a linear structure having conductivity and a linear shape. Such a linear structure may be, for example, a wire, a fiber, a thread, or a yarn. For example, the first wiring 1 and/or the second wiring 2 may have a cross section having a circular shape, an elliptical shape, or a rectangular shape. However, the embodiments of the present invention are not limited thereto.

The first wiring 1 and the second wiring 2 are illustrated as linearly extending, but the embodiments of the present invention are not limited thereto, and the first wiring 1 and the second wiring 2 may extend in one direction by being manipulated in various methods such as refracting, bending, spinning, winding, spiraling, meandering, overlapping, twisting, or a combination thereof. Furthermore, the second wiring 2 may be disposed to surround the first wiring 1 or the first wiring 1 may be disposed to surround the second wiring 2. Alternatively, the first wiring 1 may be disposed to pass through the second wiring 2 or the second wiring 2 may be disposed to pass through the first wiring 1.

The first wiring 1 may include a metal layer or a metal core 1c and a surface layer, for example, a metal oxide surface layer is, which is disposed on the metal layer or the metal core 1c. The metal layer 1c may be an aluminum wire. The metal oxide surface layer is may be an oxide film of a metal contained in the metal layer 1c, for example, a native oxide film of the metal contained in the metal layer 1c. Specifically, the metal oxide surface layer is may be an aluminum oxide surface layer. The metal oxide surface layer is illustrated as being disposed to surround the metal layer 1c, but the embodiments of the present invention are not limited thereto, and the oxide surface layer is may be limitedly disposed on at least one portion of a surface of the metal layer 1c, for example, on a portion in contact with the second wiring 2.

In another example, a conductive or non-conductive base layer or a base core 1c' may be coated with the metal layer 1c. The base core 1c', which is a linear structure or a fiber, may be a metal fiber (or a wire) different from a metal of the metal layer 1c, a conductive polymer fiber, an insulating polymer fiber, a carbon fiber, or a combination thereof. The coating of the base core 1c' with a metal may be performed using a dry method or a wet method. Further, the metal coating may be performed to surround the base core 1c' or may be performed on a portion of the base core 1c'. Such a metal coating may be performed using a sputtering process, an atomic layer deposition process, a wet coating process in which the metal is coated by dissolving and dispersing appropriate metal precursor in a solvent, electroplating, or electroless plating, but the embodiments of the present invention are not limited thereto.

The second wiring 2 may be a wiring including a carbon-containing surface layer 2s. In one example, the second wiring 2 may include a conductive or non-conductive base core 2c and the carbon-containing surface layer 2s disposed on at least one portion of the base core 2c. The base core 2c, which is a linear structure or a fiber, may be a metal fiber (or a wire), a conductive polymer fiber, an insulating polymer fiber, a carbon fiber, or a combination thereof. In another example, the second wiring 2 may have a single structure of a carbon fiber. In this case, the carbon-containing surface layer 2s may be provided by a surface of the carbon fiber itself. The carbon-containing surface layer 2s or the carbon fiber may include an amorphous carbon or a crystalline carbon such as graphene, carbon nanotubes, or the like.

The second wiring 2 may come in point-contact with the first wiring 1. A contact interface CI defined by such point-contact may have a width or a length ranging from several nm to several μm, and thereby a unit cell may be defined. The width or the length of the contact interface CI is not limited thereto.

In the case in which the contact interface CI is formed by the first wiring 1 and the second wiring 2, when variable voltage or current is applied between the first wiring 1 and the second wiring 2, reversibly electrochemical reaction products may be generated or destroyed at the contact interface CI between the wirings 1 and 2 which are in point-contact with each other while current flows through the first wiring 1 and the second wiring 2. Due to the generation or destruction of the reversibly electrochemical reaction products, two or more resistance value levels may be provided on a conductive path formed by the contact of the first wiring 1 and the second wiring 2, and information may be stored by assigning, for example, a logical value of "0" or "1" to the resistance value levels.

For example, when a set voltage having a negative value is applied to the second wiring 2 while a ground voltage $V_0$ is applied to the first wiring 1, metal carbon oxides and oxygen vacancy filaments are generated in the metal oxide surface layer is or between the metal oxide surface layer is and the carbon-containing surface layer 2s, and a conductive path is generated between the metal core 1c and the second wiring 2, and thus a low resistance state (LRS) may be derived. Meanwhile, when a reset voltage having a positive value is applied to the second wiring 2 while the ground voltage $V_0$ is applied to the first wiring 1, some of the oxygen vacancy filaments which were generated are destroyed, and the conductive path between the metal core 1c and the second wiring 2 is disconnected, and thus a high resistance state (HRS) may be derived.

Figure 3A:
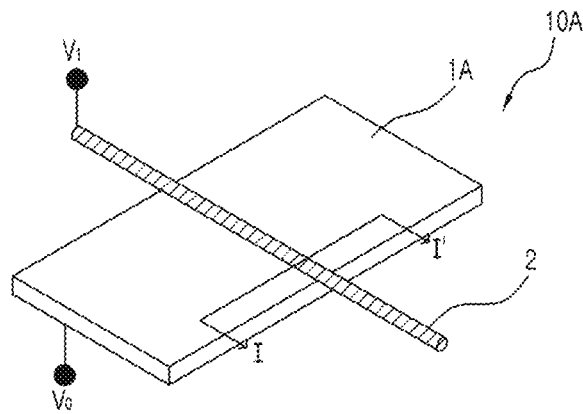
FIGS. 3A and 3B are perspective views illustrating resistance-switching devices according to embodiments of the present invention.
Figure 3B:
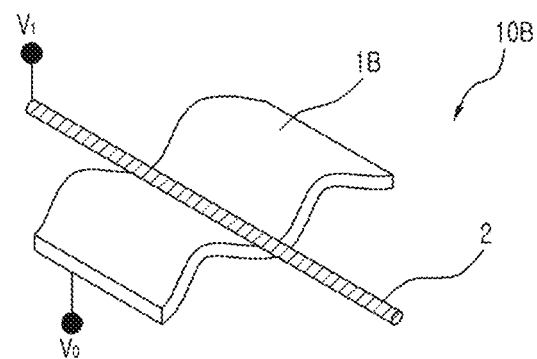
Figure 3C:
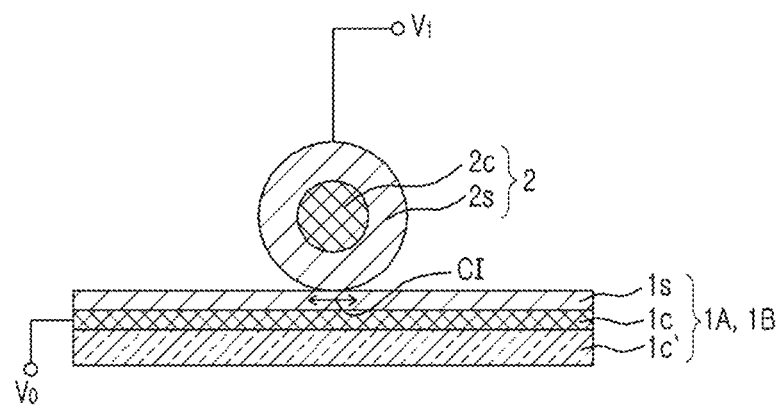
FIG. 3C is a cross-sectional view taken along line I-I' of FIG. 3A.

FIGS. 3A and 3B are perspective views illustrating resistance-switching devices according to embodiments of the present invention, and FIG. 3C is a cross-sectional view taken along line I-I' of FIG. 3A.

Referring to FIGS. 3A, 3B, and 3C, resistance-switching devices 10A and 10B includes first wirings 1A and 1B which are planar structures, respectively, and a second wiring 2 which is a linear structure in contact with each of the first wirings 1A and 1B. The first wirings 1A and 1B may have a firm planar structure (illustrated in FIG. 3A) or a flexible planar structure (illustrated in FIG. 3B). The planar structures may be films.

The second wiring 2 will be described with reference to parts described in FIGS. 1A, 1C, and 2.

The first wirings 1A and 1B may include the metal film 1c and a surface layer, for example, the metal oxide surface layer is which is disposed on the metal film 1c. The metal film 1c may be an aluminum film. The metal oxide surface layer is may be an oxide film of a metal contained in the metal film 1c, for example, a native oxide film of the metal contained in the metal film 1c. Specifically, the metal oxide surface layer is may be an aluminum oxide surface layer. The metal oxide surface layer is illustrated as being disposed on an entire surface of the metal film 1c, but the embodiments of the present invention are not limited thereto, and the metal oxide surface layer is may be limitedly disposed on at least one portion of the surface of the metal film 1c, for example, a portion in contact with the second wiring 2.

In another example, the metal film 1c may be disposed on a conductive or non-conductive base layer 1c'. The base layer 1c' may be a metal film different from a metal of the metal film 1c, a conductive polymer film, an insulating polymer film, a carbon film, or a combination thereof. Specifically, the base layer 1c' may be a resin film such as polyimide, or a material such as a fabric, cotton, paper, and a non-woven fabric. A coating of the base layer 1c' with a metal may be performed using a dry or wet method. Further, the metal coating may be performed on the entire surface of the base layer 1c' or on a portion of the base layer 1c'. The metal coating may be performed using a sputtering process, an atomic layer deposition process, a wet coating process in which the metal is coated by dissolving and dispersing an appropriate metal precursor in a solvent, electroplating, or electroless plating, but the embodiments of the present invention are not limited thereto.

The second wiring 2 is illustrated as linearly extending, but the embodiments of the present invention are not limited thereto, and the second wiring 2 may extend by being manipulated in various methods such as refracting, bending, spinning, winding, spiraling, meandering, overlapping, twisting, or a combination thereof. Furthermore, the second wiring 2 may be disposed to surround the first wirings 1A and 1B or the first wirings 1A and 1B may be disposed to surround the second wiring 2. Alternatively, the second wiring 2 may be disposed to pass through the first wirings 1A and 1B.

The second wiring 2 may come in line-contact with the first wirings 1A and 1B. The contact interface CI defined by such line-contact may have a width ranging from several nm to several μm, and thereby a unit cell may be defined. The width of the contact interface CI is not limited thereto.

In the case in which the contact interface CI is formed by each of the first wirings 1A and 1B and the second wiring 2, when variable voltage or current is applied between the first wirings 1A and 1B and the second wiring 2, reversibly electrochemical reaction products may be generated or destroyed at the contact interface CI of the wirings 1A or 1B, and 2 which come in line-contact with each other while current flows through the first wiring 1A or 1B and the second wiring 2. Due to the generation or destruction of the reversibly electrochemical reaction products, two or more resistance value levels may be provided on a conductive path by each of the first wirings 1A and 1B and the second wiring 2, information may be stored by assigning, for example, a logical value of "0" or "1" to the resistance value levels.

Figure 4A:
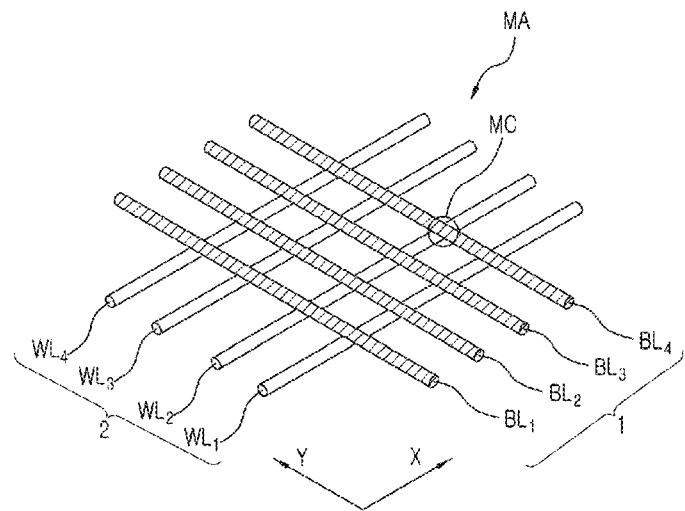
FIGS. 4A, 4B, and 4C are perspective views illustrating resistance-switching device cell arrays according to embodiments of the present invention.
Figure 4B:
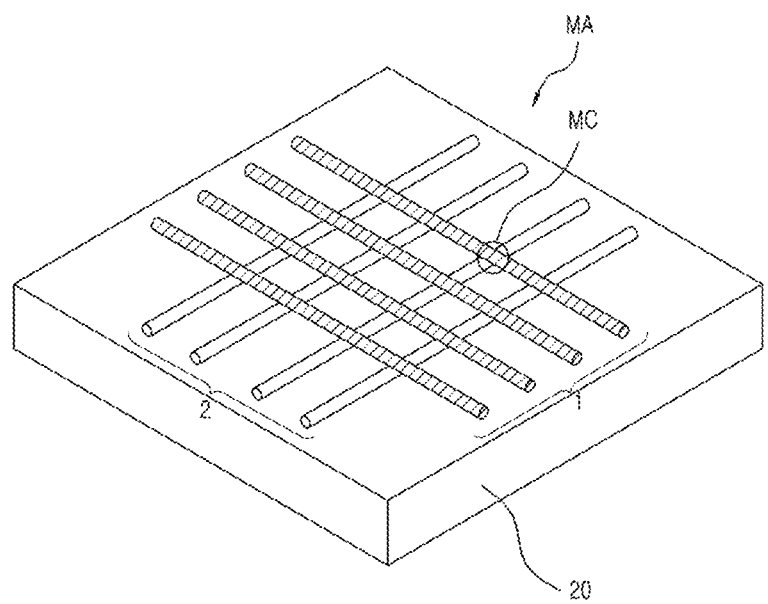
Figure 4C:
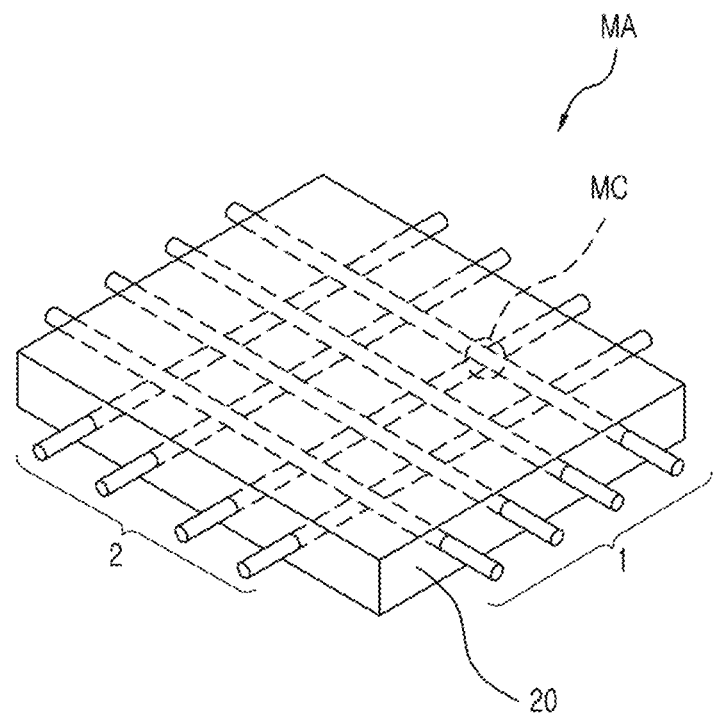

FIGS. 4A, 4B, and 4C are perspective views illustrating resistance-switching device cell arrays according to embodiments of the present invention.

Referring to FIG. 4A, a plurality of first wirings 1 which are arranged in parallel in one direction and a plurality of second wirings 2 which cross the first wirings 1 and are arranged below the first wirings 1 in parallel are provided. A plurality of unit cells MCs may be defined by crossings of the first wirings 1 and the second wirings 2, and a resistance-switching device cell array MA including the plurality of unit cells MCs may be provided. Any of the first wirings 1 and the second wirings 2 may be word lines $WL_1$ to $WL_n$ and the other thereof may be bit lines $BL_1$ to $BL_n$.

Each of the cells MC may indicate a LRS and a HRS at a contact interface between the first wiring 1 and the second wiring 2 by an oxygen vacancy filament which is generated or destroyed according to a direction or a size of an electric field applied to the first wiring 1 and the second wiring 2.

Since the unit cells are formed between the first wirings 1 and the second wirings 2 and only by the wirings being in contact with each other without any other material layer, a cell array MA having a very simple structure may be implemented. Further, since the first and second wirings 1 and 2 are flexible, a device which is operable in refracting, bending, wrinkling, folding, flexing, and the like of the cell array MA and in which molding or shape changing is freely performed may be provided.

Referring to FIGS. 4B and 4C, the resistance-switching device cell array MA may be disposed on an appropriate support 20 or may be embedded in the support 20. In other words, the support 20 may be combined with at least one of the first wiring 1 and the second wiring 2 in a contact manner. In this case, the first wiring 1 and the second wiring 2 may maintain a stable combination or a stable contact state. Meanwhile, peripheral circuits may be mounted on the support 20.

The support 20 is illustrated as having a planar structure, but the embodiments of the present invention are not limited thereto, and the support 20 may have another three-dimensional shape. In one embodiment, the support 20 may be a fabric, a non-woven fabric, cotton, paper, a flexible insulating sheet, or a combination thereof, but the embodiments of the present invention are not limited thereto. Due to the combining with the support 20, the contact state between the first wiring 1 and the second wiring 2 in the cell array MA may be maintained even when manipulated such as being bent and fixed, and thus a flexible device may be implemented.

Figure 5A:
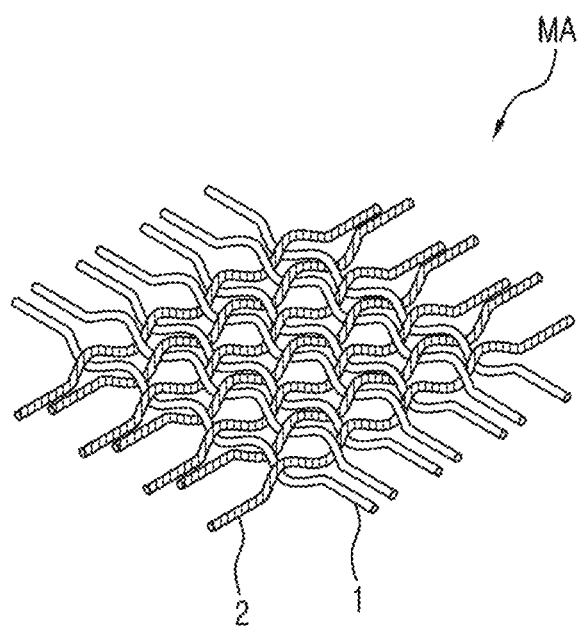
FIGS. 5A and 5B are perspective views illustrating woven type cell arrays according to embodiments of the present invention.
Figure 5B:
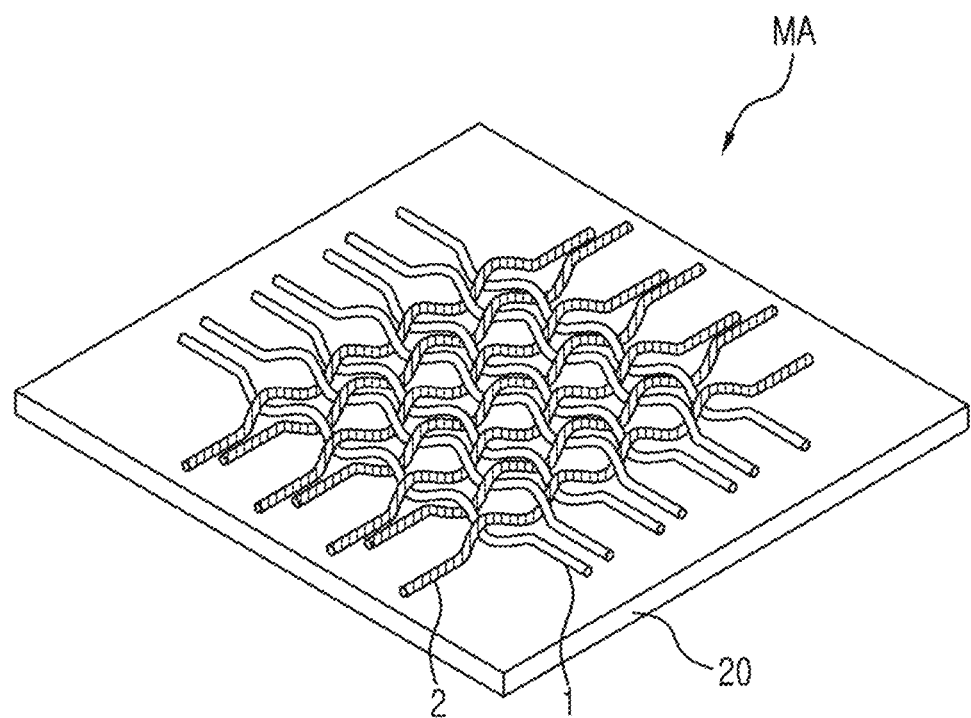

FIGS. 5A and 5B are perspective views illustrating woven type cell arrays according to embodiments of the present invention.

Referring to FIG. 5A, a cell array MA implemented in a woven form is illustrated. In other words, the cell array MA may have a form in which first wirings 1 and second wirings 2 serving as a warp and a weft are interlaced with each other, that is, a woven form. Specifically, the plurality of first wirings 1 which are parallel to each other and the plurality of second wirings 2 which are parallel to each other are disposed to cross each other, wherein each first wiring 1 may cross an upper portion of an arbitrary second wiring 2 and then cross a lower portion of another second wiring 2 adjacent to the arbitrary second wiring 2, and each second wiring 2 may cross an upper portion of an arbitrary first wiring 1 and then cross a lower portion of another first wiring 1 adjacent to the arbitrary first wiring 1. However, the embodiments of the present invention are not limited thereto, and woven type cell arrays having various structures may be provided by applying various fabric manufacturing processing techniques.

Referring to FIG. 5B, the cell array MA described with reference to FIG. 5A may be disposed on an appropriate support 20 or may be embedded in the support 20 as described with reference to FIGS. 4B and 4C. In this case, a contact state between the first wiring 1 and the second wiring 2 may be strengthened or maintained.

Figure 6A:
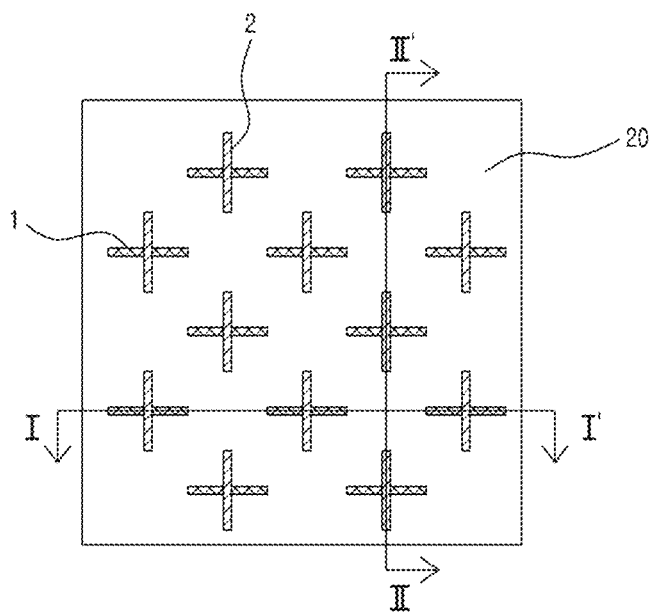
FIG. 6A is a plan view illustrating a sewn type cell array according to one embodiment of the present invention.
Figure 6B:
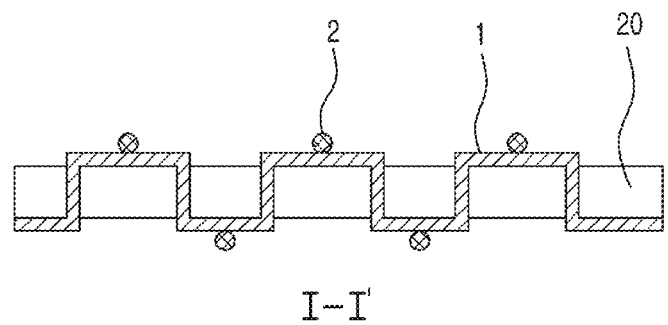
FIG. 6B is a cross-sectional view taken along line I-I' of FIG. 6A.
Figure 6C:
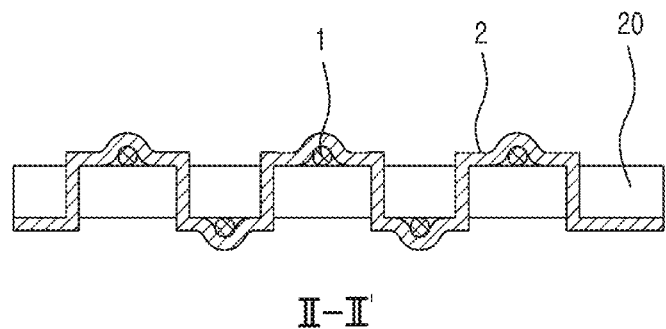
FIG. 6C is a cross-sectional view taken along line II-II' of FIG. 6A.

FIG. 6A is a plan view illustrating a sewn type cell array according to one embodiment of the present invention, FIG. 6B is a cross-sectional view taken along line I-I' of FIG. 6A, and FIG. 6C is a cross-sectional view taken along line II-II' of FIG. 6A.

Referring to FIGS. 6A, 6B, and 6C, a cell array MA having a form in which the cell array MA is sewn onto a support is illustrated. A support 20 may be provided, and first wirings 1 and second wirings 2 may be combined with the support 20 by being threaded or stitched from a top surface of the support 20 toward a bottom surface thereof or from the bottom surface of the support 20 toward the top surface thereof. Specifically, the first wiring 1 may be disposed by being extended in a first direction by a predetermined length on an upper surface of the support 20, passed through the support 20, extended in the first direction by the predetermined length on a lower surface of the support 20, and then passed through the support 20 again to come out from the upper surface of the support 20, and repeating those things. Meanwhile, the second wiring 2 may be disposed by being extended in a second direction by a predetermined length on the upper surface of the support 20, passed through the support 20, extended in the second direction by the predetermined length on the lower surface of the support 20, and then passed through the support 20 again to come out from the upper surface of the support 20, and repeating those things. In this case, the first wirings 1 and the second wirings 2 may be disposed on each of the upper surface and the lower surface of the support 20 to cross each other. A crossing point of the first wiring 1 and the second wiring 2 may be defined as a single cell, and may provide low resistance and high resistance as described with reference to FIG. 2.

The support 20 may have an insulating property and may be, for example, a fabric. Furthermore, the support 20 may be a cloth or a bag made of a fabric, and in this case, the first wirings 1 and the second wirings 2 may be integrated with the fabric, that is, the cloth or the bag, by threading or stitching, and thus a smart cloth or a smart bag may be implemented. As another example, the support 20 may be a portion of at least one of a hat, a watch, curtains, and bedding, but the embodiments of the present invention are not limited thereto.

Figure 7:
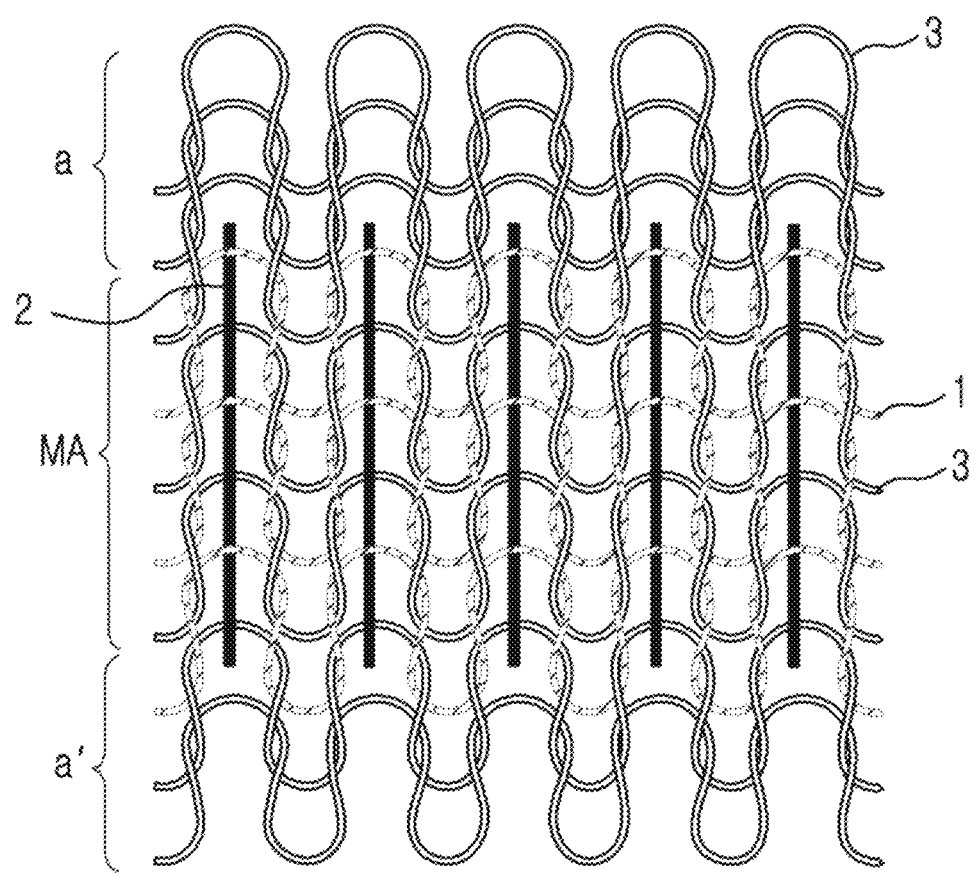
FIG. 7 is a plan view illustrating a knit type cell array according to one embodiment of the present invention.

FIG. 7 is a plan view illustrating a knit type cell array according to one embodiment of the present invention.

Referring to FIG. 7, a cell array MA implemented in a knit form is illustrated. Specifically, a cell array MA interlocked with supports a and a' may be provided between the supports a and a' in which an insulating linear structure 3, that is, fibers, wires, threads, or yarns are knitted. In the cell array MA, any of a first wiring 1 and a second wiring 2, for example, the first wiring 1, may be formed as a single conductive row which is made with loops through which the first wiring 1 is engaged with any portion of the supports a and a', and the insulating linear structure 3 is formed as a single insulating row which is made with loops through which the insulating linear structure 3 is engaged with the first wiring 1, wherein the conductive row formed with the first wiring 1 and the insulating row formed with the insulating linear structure 3 may be alternately disposed. The other of the first wiring 1 and the second wiring 2, for example, the second wiring 2, may be disposed in a column while crossing the first wiring 1, and may be disposed to cross a lower portion of the first wiring 1 disposed in a conductive row and cross an upper portion of the insulating linear structure 3 disposed in an insulating row adjacent thereto. A crossing point of the first wiring 1 and the second wiring 2 may be defined as a single cell, and may provide low resistance and high resistance as described with reference to FIG. 2.

Furthermore, the support 20 including the cell array MA may be a cloth or a bag, and in this case, the first wiring 1 and the second wiring 2 may be integrated with the cloth or the bag, and thus a smart cloth or a smart bag may be implemented. As another example, the support 20 including the cell array MA may be a portion of at least one of a hat, a watch, curtains, or bedding, but the embodiments of the present invention are not limited thereto.

Figure 8:
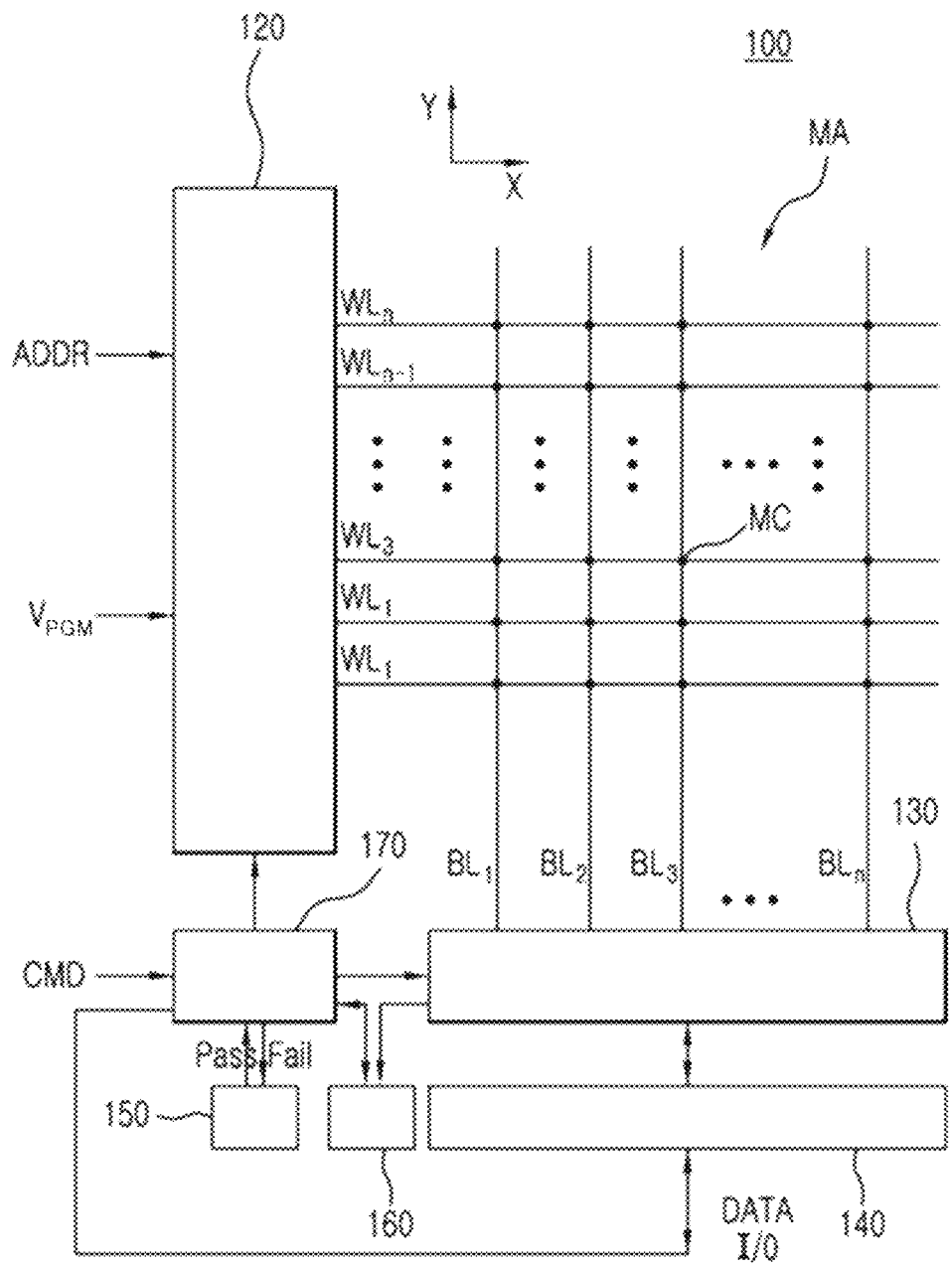
FIG. 8 is a block diagram illustrating a non-volatile memory device according to one embodiment of the present invention.

FIG. 8 is a block diagram illustrating a non-volatile memory device according to one embodiment of the present invention.

Referring to FIG. 8, a non-volatile memory device 100 may include a memory cell array MA, a row decoder 120, a read-and-program circuit 130, and a column decoder 140. The memory cell array MA may be any one cell array of the cell arrays described with reference to FIGS. 4A, 4B, 4C, 5A, 5B, 6A, and 7.

The memory cell array MA may be connected to the row decoder 120 through word lines $WL_1$ to $WL_n$. The memory cell array MA may be connected to the read-and-program circuit 130 through bit lines $BL_1$ to $BL_n$. At least one group of a group of the word lines $WL_1$ to $WL_n$ and a group of the bit lines $BL_1$ to $BL_n$ may be the above-described first wirings 1, and the other group thereof may be the above-described second wirings 2.

A plurality of memory cells MC may be defined by crossings of the word lines $WL_1$ to $WL_n$ and the bit lines $BL_1$ to $BL_n$, that is, by crossings of the first wirings 1 and the second wirings 2. Each of the memory cells MC may provide a LRS and a HRS at a contact interface between the first wirings 1 and the second wirings 2 by an oxygen vacancy filament which is generated or destroyed according to a direction or a size of an electric field applied to the first wiring 1 and the second wiring 2.

Since the memory cell is formed between the first wirings 1 and the second wirings 2 and by the wirings being in contact with each other without any other material layer, a memory cell array MA having a very simple structure may be implemented. Further, since the first and second wirings 1 and 2 are flexible, a non-volatile memory device which is operable in refracting, bending, wrinkling, folding, flexing, and the like of the memory cell array MA and in which molding or shape changing is freely performed may be provided.

A plurality of memory cells in a row direction connected to respective word lines $WL_1$ to $WL_n$ may constitute a logical page, and the number of pages for each of the word lines $WL_1$ to $WL_n$ may be determined by a storage capacity of the memory cell. The plurality of memory cells MC have a two-dimensional array in which the memory cell array MA is formed, but this is only an example, and they may have a three dimensional structure by being manipulated such as being warped and bent. In another example, a three-dimensional structure in which one or more memory cell arrays MA are vertically stacked may be provided.

The row decoder 120 may select any word line of a selected memory block. The row decoder 120 may apply a word line voltage supplied from a voltage generator (not illustrated) to the word lines of the selected memory block. When a program operation is performed, the row decoder 120 may apply a program voltage $V_{PGM}$ and a verification voltage to the selected word line and may apply a ground voltage or a pass voltage to unselected word lines. A switching device such as a transistor may be combined with the memory cell to select the cell as necessary.

The memory cell array MA may be addressed by the bit lines $BL_1$ to $BL_n$ through the column decoder 140. The read-and-program circuit 130 may receive data transferred from the outside or output data to the outside through the column decoder 140. The read-and-program circuit 130 may include a page buffer, and may operate as a sense amplifier or a program driver according to an operation mode. In this specification, "read-and-program circuit" and "page buffer" may be compatibly used as equivalent terms, and any one does not exclude the other. When the program operation is performed, the read-and-program circuit 130 receives data from an external circuit and transfers a bit line voltage corresponding to data which will be programmed with the bit lines of the memory cell array MA to the external circuit. When a read operation is performed, the read-and-program circuit 130 may read data stored in the selected memory cell through a bit line, latch the read data, and then output the read data to the outside.

The read-and-program circuit 130 may perform a verification operation accompanying the program operation of the memory cell in response to a transmission signal transmitted from a control circuit 170, and output a verification result as a signal of the page buffer multiple times in response to the transmission signal. In one embodiment, the read operation of the read-and-program circuit 130 may be performed by charge integration using a bit line parasitic capacitor. The charge integration may be performed through a current sensing circuit, and may detect a program state of the memory cell.

A pass-or-fail verification circuit 150 verifies whether a memory cell reaches a desired level each time at which a count of a program loop of the memory cell is increased, for example, using an incremental step pulse programming (ISPP) operation method. When the memory cell has a desired threshold voltage, that is, a target value, it is determined as a program pass, and the program operation and the program verification operation for the memory cell are completed, but when the memory cell does not reach the desired threshold voltage, it is determined as a program fail, and the pass-or-fail verification circuit 150 may generate a count signal (not illustrated). The pass-or-fail verification circuit 150 may determine whether a program succeeds and transfer a determination result to the control circuit 170.

A counter 160 counts the number of times an erase operation is performed on the memory cell. In another embodiment, when the erase operation is performed multiple times, the control circuit 170 may receive the number of times the erase operation is performed counted by the counter 160, and perform a pre-program operation when the erase operation is performed a predetermined number of times. The erase operations may be simultaneously performed on all memory cells in units of blocks.

The control circuit 170 performs transmission control of data and sequence control of write (or program)/erase/read operations of the data in response to a command CMD. The control circuit 170 may control the row decoder 120, the read-and-write circuit 130, the column decoder 140, the pass-or-fail verification circuit 150, and the counter 160 to perform a pulse program operation and a verification operation, for example, using an ISPP method.

The control circuit 170 may determine whether a program operation is completed or continues with reference to program success or failure (Pass/Fail) transmitted from the pass-or-fail verification circuit 150. When the control circuit 170 receives a result of program fail (Fail) from the pass-or-fail verification circuit 150, the control circuit 170 controls a voltage generator (not illustrated) which generates the program voltage and the verification voltage and the page buffer 130 to proceed with a subsequent program loop. Thus, in order to execute a program according to an increasing number of times of program loops, the control circuit 170 may receive a sequence of the program loops. Conversely, when the control circuit 170 receives a result of program pass (Pass), the program operation with respect to the selected memory cells is completed.

In various designs, the memory cell array MA and the control circuit 170 may be integrated into the same chip or may be disposed on separate chips. In another embodiment, peripheral circuits for driving the memory cell array MA may be formed as a semiconductor chip by silicon processing, and the memory cell array MA may be separately formed as illustrated in FIG. 4A.

Figure 9:
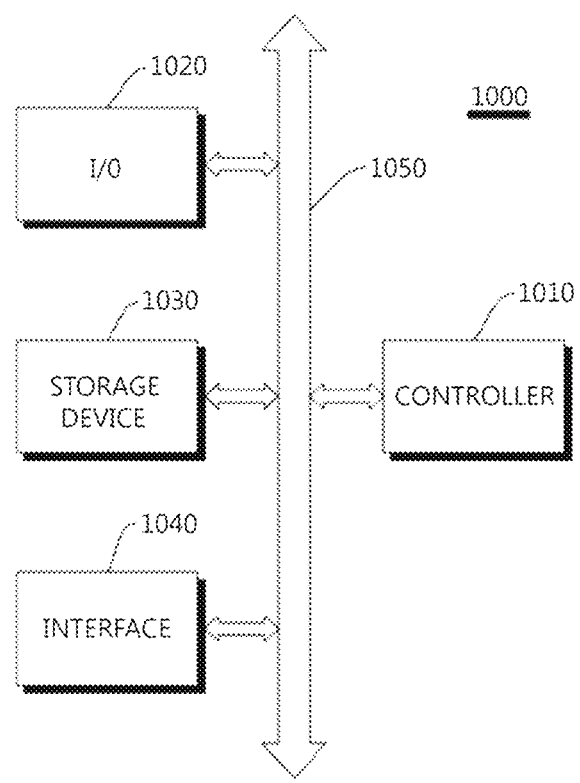
FIG. 9 is a block diagram illustrating an electronic system 1000 including the non-volatile memory device according to one embodiment of the present invention.

FIG. 9 is a block diagram illustrating an electronic system 1000 including the non-volatile memory device according to one embodiment of the present.

Referring to FIG. 9, the electronic system 1000 may include a controller 1010, an input-and-output (I/O) device 1020, a storage device 1030, an interface 1040, and a bus 1050. The controller 1010, the I/O device 1020, the storage device 1030, and/or the interface 1040 may be combined with each other through the bus 1050.

The controller 1010 may include at least one of a microprocessor, a digital signal processor, a micro controller, and a logical device that can perform similar functions thereto. The I/O device 1020 may include a keypad, a keyboard, or a display device. The storage device 1030 may store data and/or commands and include the non-volatile memory device described with reference to FIG. 8.

In some embodiments, the storage device 1030 may have a hybrid structure further including other types of semiconductor memory devices (e.g., a dynamic random access memory (DRAM) device and/or a static RAM (SRAM) device, etc.). The interface 1040 may perform a function of transmitting data to a communication network or receiving data from the communication network. The interface 1040 may have a wired or wireless form. To this end, the interface 1040 may include an antenna or a wired or wireless transceiver. Although not illustrated, the electronic system 1000 may further include a high-speed DRAM and/or an SRAM as an operation memory for improving the operation of the controller 1010.

The electronic system 1000 may be a flexible device, and may be a wearable device such as smart clothing, a smart hat, smart shoes, and a smart watch. However, the embodiments of the present invention are not limited thereto, and the electronic system 1000 may be applied to a personal digital assistant (PDA), a portable computer, a tablet PC, a wireless phone, a mobile phone, a digital music player, a memory card, or any electronic system capable of transmitting and/or receiving information in a wireless environment. Although the above-described embodiments are mainly disclosed with respect to a memory device, these are only examples, and it should be understood by those skilled in the art that a variable resistor according to embodiments of the present invention may be applied to a fuse, an antifuse, or an ON/OFF switching device of a logical circuit such as a field programmable gate array (FPGA).

Figure 10A:
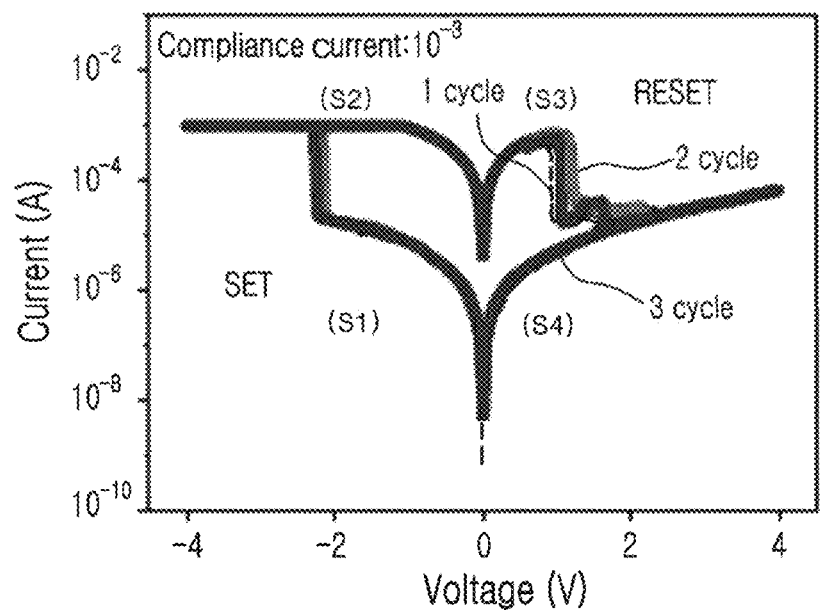
FIGS. 10A, 10B, and 10C are a current-voltage graph illustrating a resistance-switching device having a structure illustrated in FIG. 1A, a graph illustrating resistance values in a low resistance state (LRS) and a high resistance state (HRS) according to the number of cycles, and a graph illustrating a retention characteristic, respectively.

FIG. 10A is a current-voltage graph illustrating a resistance-switching device having the structure illustrated in FIG. 1A. Specifically, an aluminum-coated carbon fiber was used as a first wiring, and a non-coated carbon fiber was used as a second wiring. Since the first wiring is exposed to air, a natural aluminum oxide layer is estimated as being very thinly formed on an aluminum layer.

Referring to FIGS. 10A and 1A, while the first wiring 1 is grounded and a negative voltage is swept to the second wiring 2 in a negative direction (S1), the device is changed from a HRS to a LRS at about −2 V (SET). Then, while sweeping a negative voltage in a positive direction (S2) and while sweeping a positive voltage in a positive direction (S3), the device is maintained in the LRS. Then, the device is changed from the LRS to the HRS at about 1 V which is a positive voltage (RESET). Again, while sweeping a positive voltage in a negative direction (S4), the device is maintained in the HRS.

A program operation and an erase operation of the device may be performed using the set operation and the reset operation obtained by an appropriate voltage signal applied between the first wiring 1 and the second wiring 2. The LRS by the set operation and the HRS by the reset operation may be determined by applying an appropriate read voltage between the first wiring 1 and the second wiring 2 and detecting a size of a flowing current.

Figure 10B:
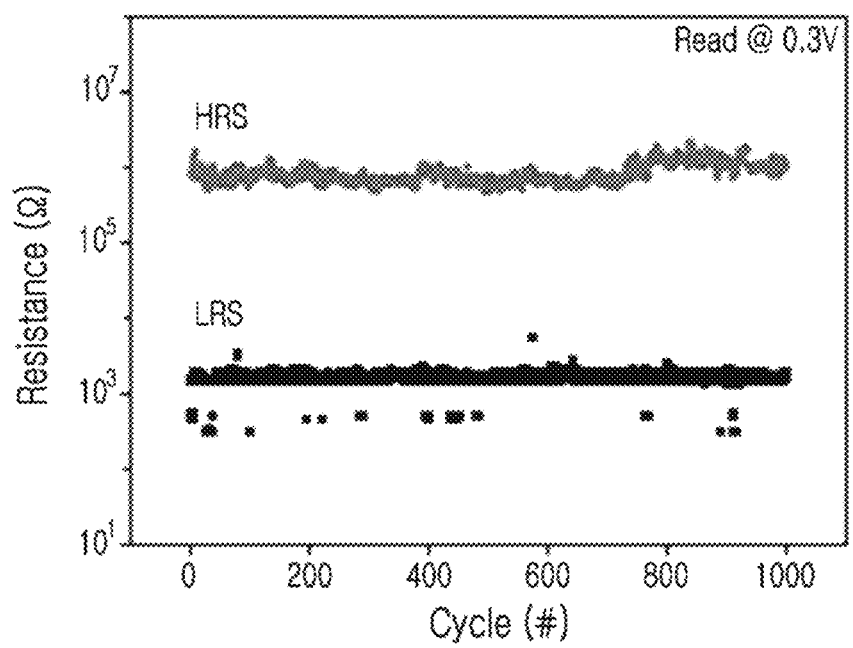

FIG. 10B is a graph illustrating resistance values in a LRS and a HRS according to the number of cycles that the resistance-switching device described with reference to FIG. 10A operates. One cycle includes a set of the SET operation and the RESET operation as described with reference to FIG. 10A, and reads resistance values at 0.3 V.

Referring to FIG. 10B, in the resistance-switching device, a difference between a resistance value in the LRS and a resistance value in the HRS is stably indicated as about $10^3$ up to a total of 1,000 cycles, and thus it may be seen that a reproducible resistance-switching device may be formed.

Figure 10C:
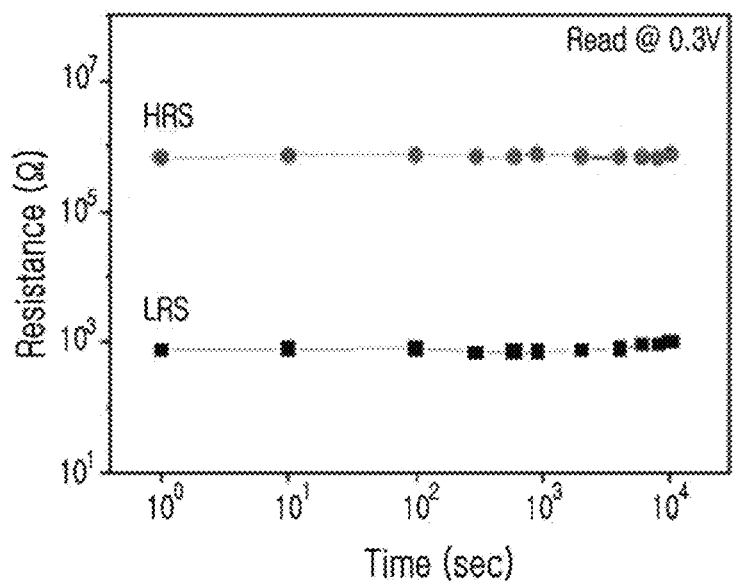

FIG. 10C is a graph illustrating a retention characteristic of the resistance-switching device described with reference to FIG. 10A. Specifically, immediately after the resistance-switching device becomes in the LRS (or the HRS), the resistance-switching device is left for 10 seconds, 100 seconds, 1,000 seconds, and 10,000 seconds, and then resistance values are read at 0.3 V.

Referring to FIG. 10C, it is indicated that data may be maintained up to 10,000 seconds. This means that a data maintaining characteristic is excellent.

Thus, in the resistance-switching devices according to the embodiments of the present invention, as voltages are applied between the first wiring and the second wiring, two states of low resistance and high resistance may appear between these two wirings as described with reference to FIGS. 10A, 10B, and 10C. Therefore, it may be seen that the resistance-switching devices according to the embodiments of the present invention may be applied to a resistance-switching memory (e.g., a resistive random-access memory (RRAM)) as described with reference to FIGS. 8 and 9.

Figure 11:
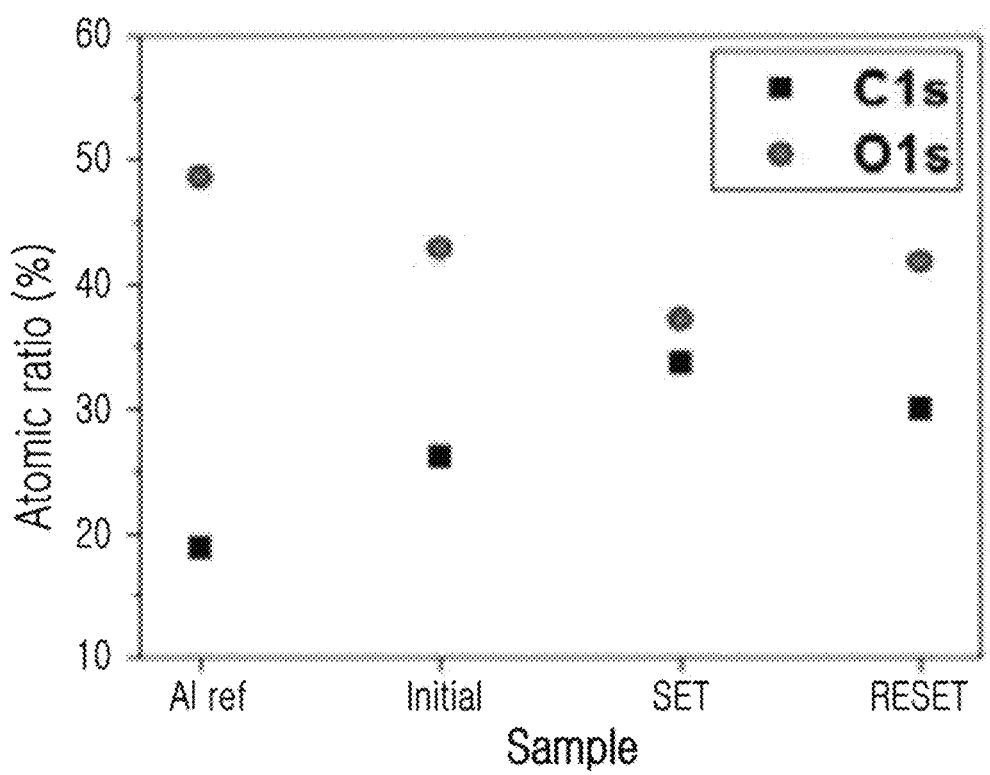
FIG. 11 is a graph illustrating a composition change of a contact interface between a first wiring serving as an aluminum wire and a second wiring serving as a carbon fiber in a driving process of a resistance-switching device.

FIG. 11 is a graph illustrating a composition change of a contact interface between a first wiring serving as an aluminum wire and a second wiring serving as a carbon fiber in a driving process of the resistance-switching device. Composition analysis is performed using energy-dispersive X-ray spectroscopy (EDS).

Referring to FIG. 11, atomic ratios of carbon and oxygen in an aluminum film (Al ref), in a state in which an aluminum wire and a carbon fiber only come in contact with each other (Initial), and in a set state (SET) and a reset state (RESET) during operation are illustrated. In the set state and the reset state, which are processes driven by voltages, a composition of carbon and oxygen is changed, and in the set state carbon content is increased and oxygen content is decreased in comparison to the state in which an aluminum wire and a carbon fiber only come in contact with each other (Initial). Further, in the reset state the carbon content is decreased and the oxygen content is increased in comparison to the set state.

As a result with reference to a phase change diagram according to the composition between two materials for understanding a phenomena occurring at a contact interface between aluminum and carbon, aluminium oxycarbide may be formed by reaction of a natural aluminum oxide formed on the aluminum wire with carbon as in the following reaction formula, and oxygen vacancies may be generated with the aluminium oxycarbide.

$$2Al_2O_3 + 3C \rightarrow Al_4O_4C + 2CO(g) \quad \text{[Formula 1]}$$

When a free energy change of a reaction product between the natural aluminum oxide and carbon at room temperature is calculated, $Al_4O_4C < Al_2O_3 < Al_2OC < Al_4C_3$, and it is found that a formation of a compound $Al_4O_4C$ is associated with the generation of the oxygen vacancies and results in a change of a resistance value. In other words, conductivity of the natural aluminum oxide is increased by oxygen vacancies generated while a compound $Al_4O_4C$ is formed and a LRS may be derived in a set operation, and on the other hand, the oxygen vacancies are destroyed while aluminum oxide is re-generated as in the following reaction formula and a HRS may be derived in a reset operation.

$$Al_4O_4C + O_2(g) \rightarrow 2Al_2O_3 + C \quad \text{[Formula 2]}$$

Figure 12:
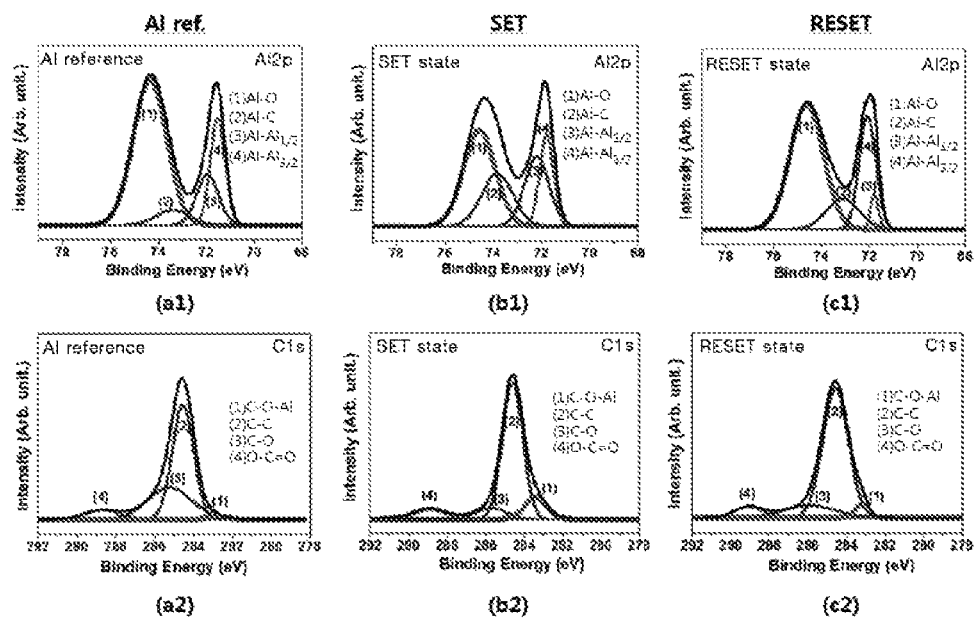
FIG. 12 is X-ray photoelectron spectroscopy graphs illustrating composition changes of a contact interface between a first wiring serving as an aluminum wire and a second wiring serving as a carbon fiber in a driving process of a resistance-switching device.

FIG. 12 is X-ray photoelectron spectroscopy graphs illustrating a composition change of a contact interface between a first wiring serving as an aluminum wire and a second wiring serving as a carbon fiber in a driving process of the resistance-switching device. Specifically, drawings (a1) and (a2) respectively illustrate a peak Al2p and a peak C1s of an aluminum film (Al ref), drawings (b1) and (b2) respectively illustrate a peak Al2p and a peak C1s of a contact interface in a set state (SET) of operations of the resistance-switching device, and drawings (c1) and (c2) illustrate a peak Al2p and a peak C1s of a contact interface in a reset state (RESET) of the operations of the resistance-switching device.

Referring to FIG. 12, since an intensity of a peak which indicates an Al—O bond is increased at the peak Al2p in the reset state (c1), it may be inferred that aluminum oxide is formed in the reset state. Meanwhile, since an intensity of a peak which indicates a C—O—Al bond is increased at the peak C1s in the set state (b2), it may be inferred that aluminium oxycarbide is formed in the set state. With these results, oxygen vacancies are generated by forming aluminium oxycarbide, that is, aluminum oxycarbide ($Al_4O_4C$), by a set bias in a contact interface between the carbon fiber and the aluminum wire, that is, in a natural aluminum oxide film, current flows through the oxygen vacancies, and thus resistance is reduced. In the case of a reset bias, it may be inferred that resistance is increased by the reverse reaction thereof.

Figure 13A:
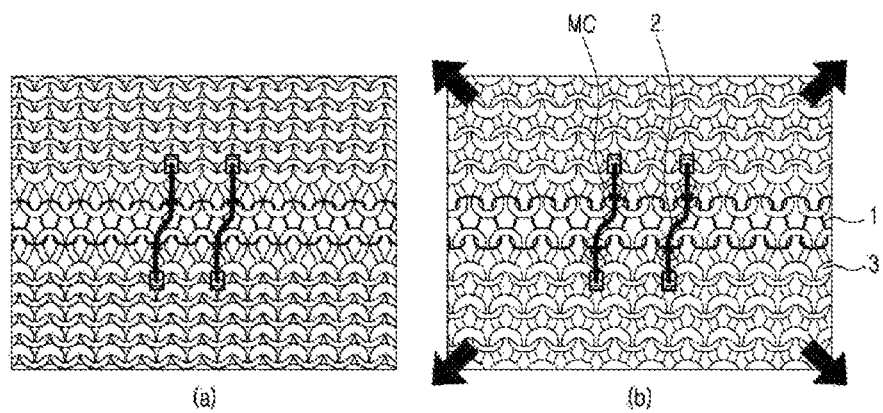
FIG. 13A(a) is a photograph illustrating a resistance-switching device and FIG. 13A(b) is a photograph illustrating the resistance-switching device stretched by applying a force thereto.
Figure 13B:
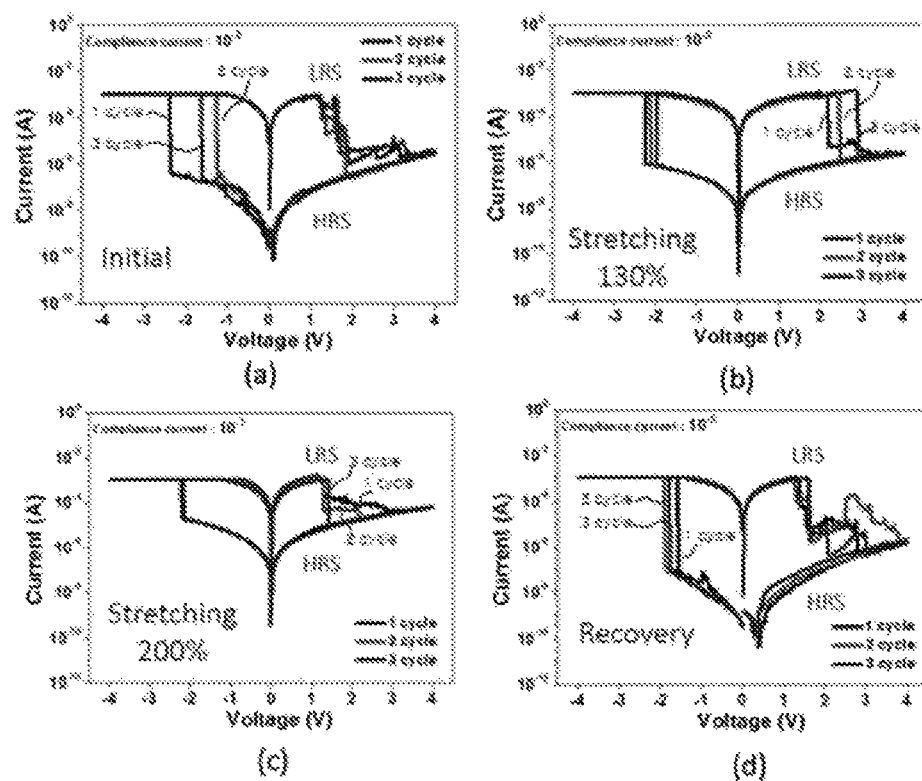
FIG. 13B(a) is a current-voltage graph in an initial state of the resistance-switching device, FIG. 13B(b) is a current-voltage graph in a state of the resistance-switching device stretched 130% by applying a force thereto, FIG. 13B(c) is a current-voltage graph in a state of the resistance-switching device stretched 200% by applying a force thereto, and FIG. 13B(d) is a current-voltage graph in a state in which the applied force is removed.
Figure 13C:
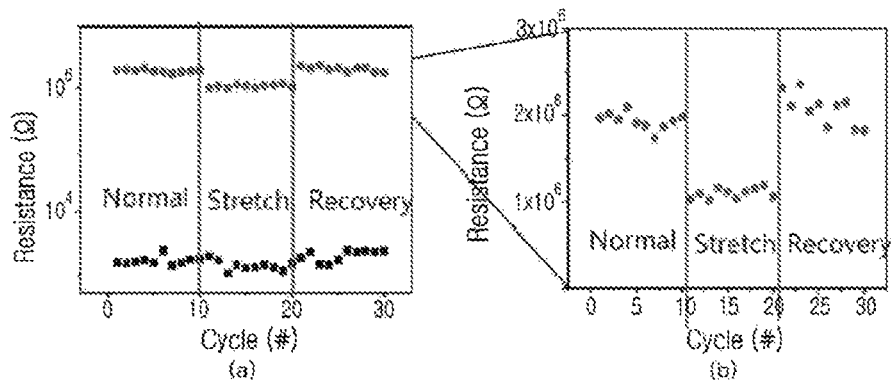
FIG. 13C is a graph illustrating resistance values in an initial state of the resistance-switching device, a state of the resistance-switching device stretched 150% by applying a force thereto, and a state in which the applied force is removed.

FIG. 13A(a) is a photograph illustrating a resistance-switching device and FIG. 13 A(b) is a photograph illustrating the resistance-switching device stretched by applying a force thereto. FIG. 13B(a) is a current-voltage graph in an initial state of the resistance-switching device, FIG. 13B(b) is a current-voltage graph in a state of the resistance-switching device stretched 130% by applying a force thereto, FIG. 13B(c) is a current-voltage graph in a state of the resistance-switching device stretched 200% by applying a force thereto, and FIG. 13B(d) is a current-voltage graph in a state in which the applied force is removed. FIG. 13C is a graph illustrating resistance values in an initial state of the resistance-switching device, a state of the resistance-switching device stretched 150% by applying a force thereto, and a state in which the applied force is removed.

Referring to FIG. 13A, the resistance-switching device has a structure similar to that of FIG. 7 and is made with a loop in which a first wiring 1 of one row is engaged with both supports in which an insulating thread 3 is knitted. Second wirings 2 form cells MC by crossing the first wiring 1 at two points, respectively, and the crossing portions are fixed by additional thread. In this case, an aluminum-coated carbon fiber is used as the first wiring 1 and a non-coated carbon fiber is used as the second wiring. Since the first wiring is exposed to air, a natural aluminum oxide layer is estimated to be very thinly formed on an aluminum layer (a).

Further, the resistance-switching device is stretched by applying a force thereto in arrow directions (b).

Referring to FIG. 13B, current values of different HRSs in a state in which a force is not applied to the resistance-switching device, that is, in an initial state (a), in the state of being stretched 130% by applying a force thereto (b), and in the state of being stretched 200% by applying a more force thereto (c) are illustrated. Further, a HRS current value similar to that of the initial state (a) is indicated in a state in which the applied force is removed (d). Specifically, a HRS current value of up to about 7 nA (@0.3 V) is indicated in the initial state (a), a HRS current value of up to about 60 nA (@0.3 V) is indicated in the state of being 130% stretched (b), a HRS current value of up to about 1,000 nA (@0.3 V) is indicated in the state of being 200% stretched (c), and a HRS current value of up to about 2 nA (@0.3 V) is indicated in the state in which the applied force is removed (d).

Referring to FIG. 13C, resistance of about $2\times10^6\Omega$ is indicated in an initial state of the resistance-switching device (Normal) and resistance of about $1\times10^6\Omega$ is indicated in a state of being stretched 150% by applying a force thereto (Stretch), and thus it may be seen that a resistance value is reduced to one-half in the state of being stretched 150%. Meanwhile, resistance of about $2\times10^6\Omega$ is indicated in a state in which the applied force is removed (Recovery), and thus it may be seen that the resistance value is restored to the initial state.

Figure 14:
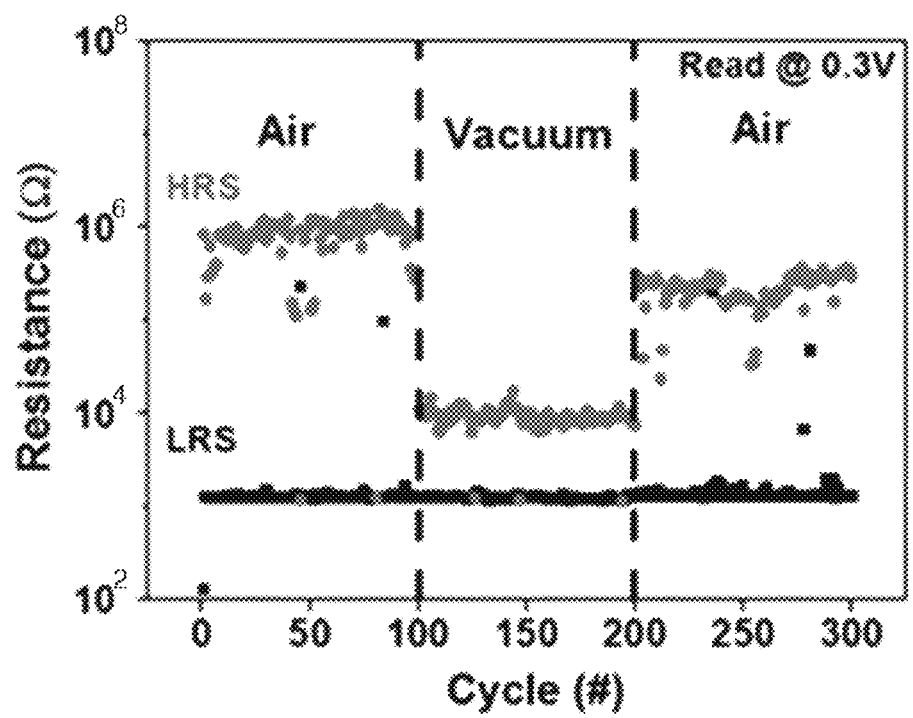
FIG. 14 is a graph illustrating a resistance change of a resistance-switching device according to an ambient oxygen concentration.

FIG. 14 is a graph illustrating a resistance change of a resistance-switching device according to an ambient oxygen concentration. A resistance-switching device having the structure illustrated in FIG. 1A, specifically, a resistance-switching device including an aluminum-coated carbon fiber as a first wiring and a non-coated carbon fiber as a second wiring is used. Since the first wiring is exposed to air, a natural aluminum oxide layer is estimated as being very thinly formed on an aluminum layer.

Referring to FIG. 14, it may be seen that, the resistance-switching device has an HRS resistance of about $10^6\Omega$ when the resistance-switching device is placed in air in a laboratory, and subsequently that the resistance-switching device has an HRS resistance of about $10^4\Omega$ when the resistance-switching device is placed in a vacuum chamber. Therefore, it may be seen that the HRS resistance value of the resistance-switching device varies according to oxygen content in an environment in which the resistance-switching device is placed. Further, it may be seen that the resistance value of the resistance-switching device is restored to the resistance value ($10^6\Omega$) in an initial state when the resistance-switching device is placed in air in the laboratory again.

Figure 15:
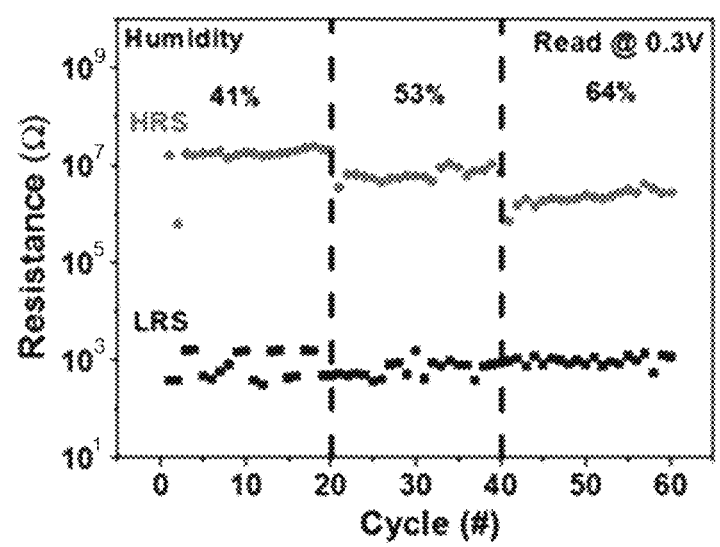
FIG. 15 is a graph illustrating a resistance change of a resistance-switching device according to ambient humidity.

FIG. 15 is a graph illustrating a resistance change of a resistance-switching device according to ambient humidity. A resistance-switching device having the structure illustrated in FIG. 1A, specifically, a resistance-switching device including an aluminum-coated carbon fiber as a first wiring and a non-coated carbon fiber as a second wiring is used. Since the first wiring is exposed to air, a natural aluminum oxide layer is estimated as being very thinly formed on an aluminum layer.

Referring to FIG. 15, when HRS resistance of the resistance-switching device is measured while the resistance-switching device is placed in environments having 41%, 53%, and 64% humidity, it may be seen that the HRS resistance value is reduced as humidity is increased. Therefore, it may be seen that the resistance value of the resistance-switching device varies according to the humidity in the environment in which the resistance-switching device is placed.

Figure 16:
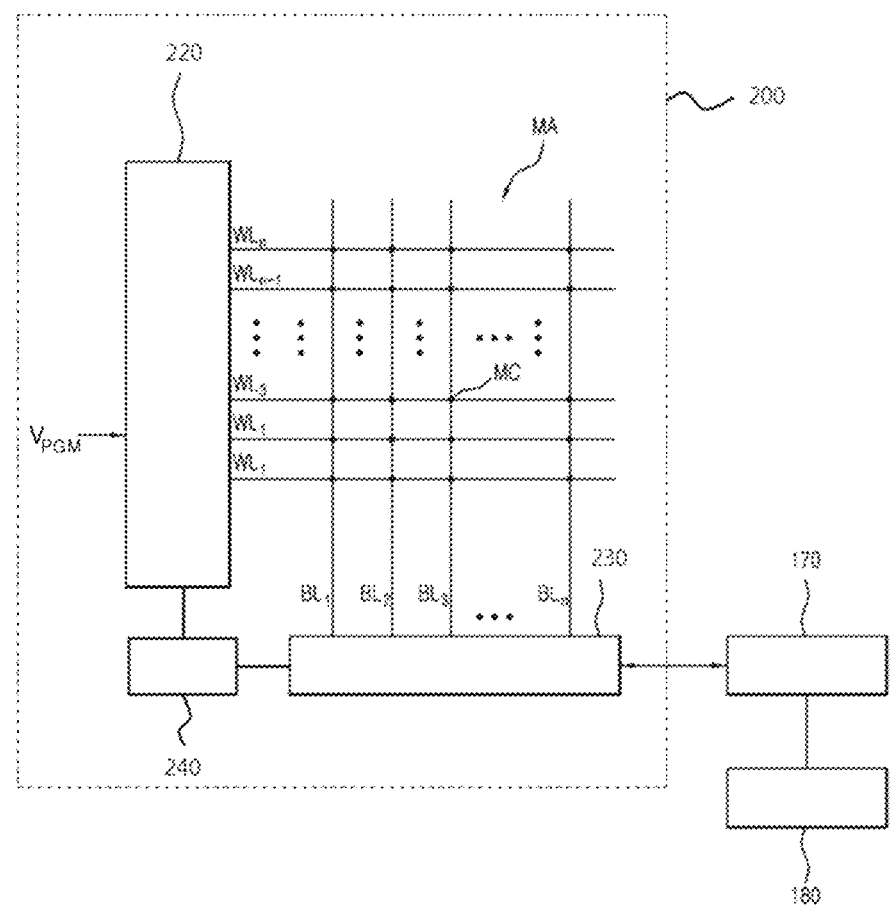
FIG. 16 is a block diagram illustrating a sensor according to one embodiment of the present invention.

FIG. 16 is a block diagram illustrating a sensor according to one embodiment of the present invention.

Referring to FIG. 16, a sensor 200 may include a cell array MA, a program circuit 220, and a read circuit 230. The cell array MA may be any one cell array of the cell arrays described with reference to FIGS. 4A, 4B, 4C, 5A, 5B, 6A, and 7.

The cell array MA may be connected to the program circuit 220 through word lines $WL_1$ to $WL_n$. The program circuit 220 may apply a program voltage to the word lines $WL_1$ to $WL_n$. The cell array MA may be connected to the read circuit 230 through bit lines $BL_1$ to $BL_n$. At least one group of a group of the word lines $WL_1$ to $WL_n$ and a group of the bit lines $BL_1$ to $BL_n$ may be the above-described first wirings 1, and the other group may be the second wirings 2. Further, the program circuit 220 and the read circuit 230 may be controlled by a controller 240, and portable power source such as a battery and the like may be connected to the controller 240.

A plurality of unit cells MCs may be defined by crossings of the word lines $WL_1$ to $WL_n$ and the bit lines $BL_1$ to $BL_n$, that is, crossings of the first wirings 1 and the second wirings 2. The unit cell MC may produce a LRS and a HRS at a contact interface of the first wiring 1 and the second wiring 2 by an oxygen vacancy filament which is generated or destroyed according to a direction or a size of an electric field applied to the first wiring 1 and the second wiring 2. In addition, the unit cell MC may have a resistance value in the HRS changed according to a degree of stretching applied thereto as described with reference to FIGS. 13A to 13C. Further, the unit cell MC may have a resistance value in the HRS changed according to a change of oxygen concentration and humidity as described with reference to FIGS. 14 and 15. Thus, the unit cell MC may produce different resistance values according to an external environment, that is, a degree of stretching, oxygen concentration, and humidity, and thus the value of resistance or current detected by the read circuit 230 may vary.

Meanwhile, the program circuit 220 may include a row decoding circuit which selects any one of the word lines, but the embodiments of the present invention are not limited thereto, and the program circuit 220 may apply the same program voltage to all of the word lines. Further, the read circuit 230 may include a column decoding circuit which selects any one of the bit lines, but the embodiments of the present invention are not limited thereto, and the read circuit 230 may simultaneously detect resistance or a current value detected from the bit lines and may detect a total value thereof. In this case, since resistance or current value of the entire cell array MA rather than each unit cell from the read circuit 230 may be detected, a change of the resistance or the current according to a change of an external environment may be more precisely detected.

The detected resistance or current value may be transmitted to an external calculating device 170 through a communication module (not illustrated). The external calculating device 170 may include a database (not illustrated) in which a degree of stretching, the concentration of oxygen, and/or humidity corresponding to resistance or a current value are stored, and may derive the degree of stretching, the concentration of oxygen, and/or humidity through the database by using the transmitted resistance or current value. The derived degree of stretching, the concentration of oxygen, and/or humidity may be displayed by a display device 180.

The external calculating device 170 and the display device 180 may be a portable computer such as a smart phone or the like in which a related program or application is installed, and the database may be a database accessible through a network.

Figure 17:
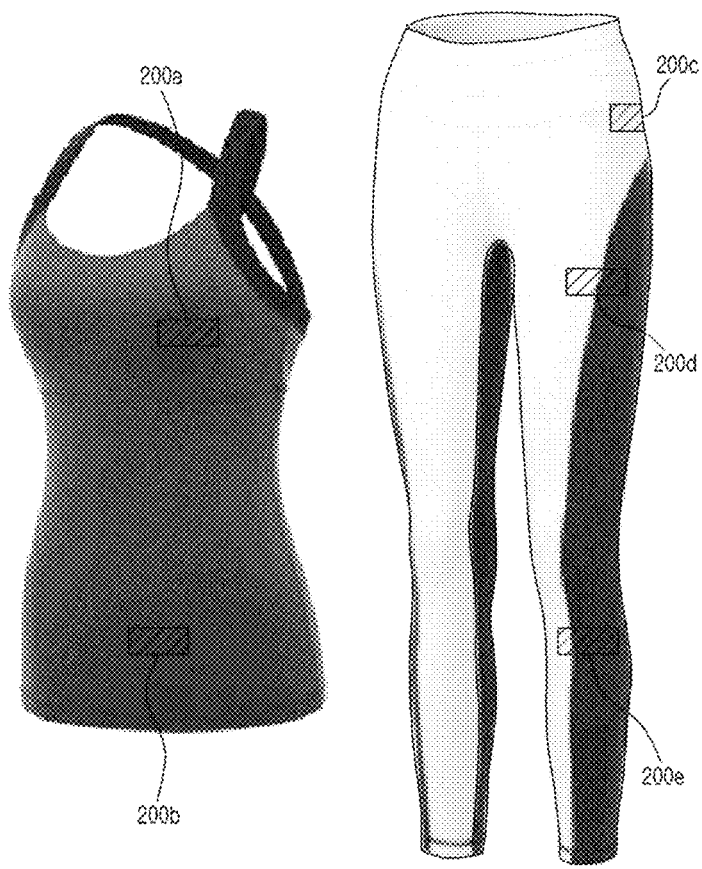
FIG. 17 is a schematic view illustrating a garment to which a sensor according to one embodiment of the present invention is attached.

FIG. 17 is a schematic view illustrating a garment to which a sensor according to one embodiment of the present invention is attached.

Referring to FIG. 17, the sensor described with reference to FIG. 16 may be combined with at least one portion of a garment by weaving (illustrated in FIG. 5A), knitting (illustrated in FIG. 7), or stitching (illustrated in FIG. 6A). Further, sensors 200a, 200b, 200c, 200d, and 200e, which are external environment sensors, may be stretching sensors for sensing a degree of stretching or sensors for sensing an oxygen concentration or humidity.

When the sensors 200a, 200b, 200c, 200d, and 200e are stretching sensors, clothes with which the stretching sensors are combined may be woven by fibers having very excellent elasticity. Meanwhile, the stretching sensors may be a chest size measurement sensor 200a, a belly size measurement sensor 200b, a hip size measurement sensor 200c, a thigh size measurement sensor 200d, or a calf size measurement sensor 200e. Such stretching sensors may be used in a virtual clothes-wearing system. Meanwhile, such stretching sensors may be used as motion detection sensors capable of detecting motions of a human body to which the sensors are attached.

Figure 18:
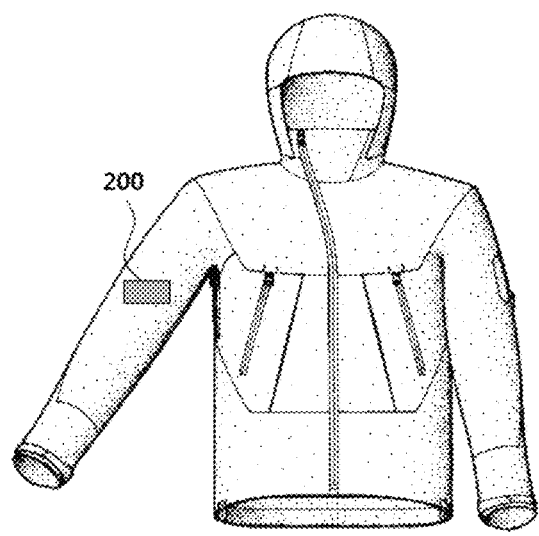
FIG. 18 is a schematic view illustrating a garment which is combined with an atmospheric gas sensor according to one embodiment of the present invention.

FIG. 18 is a schematic view illustrating a garment which is combined with an atmospheric gas sensor according to one embodiment of the present invention.

Referring to FIG. 18, the sensor according to one embodiment of the present invention, for example the sensor described with reference to FIG. 16 may be combined with at least one portion of a garment by weaving (illustrated in FIG. 5A), knitting (illustrated in FIG. 7), or stitching (illustrated in FIG. 6A). Further, the sensor 200 may be an atmospheric gas sensor for sensing an oxygen concentration or humidity.

The garment with which the oxygen concentration and humidity sensor 200 is combined may be an outdoor garment. For example, when the sensor is combined with an outdoor garment for alpine hiking, the external oxygen concentration and humidity during alpine hiking may be easily measured without a separate measuring device.

The present invention is not limited to the above-described embodiments and the accompanying drawings. While the example embodiments of the present invention and their advantages have been described in detail, it should be understood that various changes, substitutions, and alterations may be made herein without departing from the scope of the present invention.

What is claimed is:

1. A resistance-switching device comprising:
a first wiring including an aluminum oxide surface layer and an aluminum layer below the aluminum oxide surface layer, wherein the aluminum oxide surface layer is a native oxide film of the aluminum layer; and
a second wiring including a carbon-containing surface layer in contact with the aluminum oxide surface layer, wherein:
electrochemical reaction products according to a reaction of aluminum oxide and carbon are generated or destroyed at a contact interface between the aluminum oxide surface layer and the carbon-containing surface layer according to a voltage or a current applied to the first wiring and the second wiring; and
low resistance and high resistance are provided between the first wiring and the second wiring by the generation or destruction of the electrochemical reaction products.

2. The device of claim 1, wherein at least one of the first wiring and the second wiring has a linear structure.

3. The device of claim 2, wherein both of the first wiring and the second wiring have a linear structure.

4. The device of claim 1, wherein the first wiring further includes a base layer below the aluminum layer.

5. The device of claim 1, wherein the second wiring is a carbon fiber.

6. A resistance-switching device comprising:
a first wiring including an aluminum oxide surface layer; and
a second wiring including a carbon-containing surface layer in contact with the aluminum oxide surface layer, wherein:
electrochemical reaction products according to a reaction of aluminum oxide and carbon are generated or destroyed at a contact interface between the aluminum oxide surface layer and the carbon-containing surface layer according to a voltage or a current applied to the first wiring and the second wiring;
low resistance and high resistance are provided between the first wiring and the second wiring by the generation or destruction of the electrochemical reaction products; and
the electrochemical reaction products are aluminum oxycarbide.

7. The device of claim 1, wherein the first wiring and the second wiring serve as a wrap and a weft, respectively, and constitute a fabric having a woven structure.

8. The device of claim 1, further including an insulating support,
wherein:

the first wiring includes a plurality of rows disposed in parallel, and the rows are disposed by repeatedly being extended on an upper surface of the insulating support, passed through the insulating support, extended on a lower surface of the insulating support, and then passed through the insulating support again; and the second wiring is disposed by repeatedly being extended on the upper surface of the insulating support to cross a first row of the first wiring, passed through the insulating support, extended on the lower surface of the insulating support to cross a second row of the first wiring, and then passed through the insulating support again.

9. The device of claim 1, wherein:

any one of the first wiring and the second wiring has a knitted structure; and the other of the first wiring and the second wiring is disposed to cross the knitted wiring.

10. The device of claim 1, wherein the resistance-switching device is a unit cell constituting a resistance-switching memory.

11. The device of claim 1, wherein the resistance-switching device is a sensor, and the high resistance shows different values according to an ambient environment.

12. The device of claim 11, wherein the ambient environment is a degree of stretching the sensor.

13. The device of claim 11, wherein the ambient environment is an oxygen concentration or humidity of an ambient environment.

14. A garment which is combined with the resistance-switching device of claim 1.

15. A resistance-switching device comprising:

a first conductive fiber including an aluminum oxide surface layer and an aluminum layer below the aluminum oxide surface layer, wherein the aluminum oxide surface layer is a native oxide film of the aluminum layer; and a second conductive fiber including a carbon-containing surface layer in contact with the aluminum oxide surface layer, wherein the first conductive fiber and the second conductive fiber are woven or knitted, or have a fabric type which is combined on another insulating support by being stitched thereto.

16. The device of claim 15, wherein the second conductive fiber is a carbon fiber.

* * * * *